(12) United States Patent
Matsuzawa et al.

(10) Patent No.: US 6,211,686 B1
(45) Date of Patent: Apr. 3, 2001

(54) EVALUATION APPARATUS AND FABRICATION SYSTEM FOR SEMICONDUCTOR

(75) Inventors: Kazuya Matsuzawa, Kawasaki; Yukihito Oowaki, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/126,133

(22) Filed: Jul. 30, 1998

(30) Foreign Application Priority Data

Jul. 31, 1997 (JP) .................................................... 9-206269

(51) Int. Cl.[7] .......................... G01R 31/26; G01R 31/02; G01N 23/00
(52) U.S. Cl. ............................ 324/719; 324/754; 250/306
(58) Field of Search .................................. 324/719, 754, 324/765, 715, 718, 519, 717, 758, 763, 752; 438/17; 250/307, 306

(56) References Cited

U.S. PATENT DOCUMENTS 5,030,908 * 7/1991 Miyoshi et al. ...................... 324/752
5,453,703 * 9/1995 Goldfarb ............................... 324/765

OTHER PUBLICATIONS

Nanovations, vol. 3, No. 1, pp. 1–12, dated Winter 1996 and published by Digital Instruments.

* cited by examiner

Primary Examiner—Safet Metjahic
Assistant Examiner—James C Kerveros
(74) Attorney, Agent, or Firm—Finnegan, Henderson, Farabow, Garrett & Dunner, L.L.P.

(57) ABSTRACT

The present invention comprises a SCM measuring apparatus and a control section. A control section adjusts shape data of a probe tip initially inputted based on SCM measurement for a standard specimen and a simulated result by the measuring apparatus, and then performs the SCM measurement by a standard specimen, and then on the basis of the measuring result, a impurity distribution is assumed. Next, the impurity distribution is adjusted so that the CV property calculated by the SCM simulation coincides with the CV property measured by the SCM measuring apparatus, and then the CV property is calculated again. The impurity distribution in case both of the CV properties coincide with each other is determined as a definitive impurity distribution. The definitive impurity distribution is outputted to a display apparatus, a printer, and so on. Therefore, it is possible to analyze the impurity distribution with accuracy smaller than a width of the probe tip.

16 Claims, 33 Drawing Sheets

EVALUATION APPARATUS AND FABRICATION SYSTEM FOR SEMICONDUCTOR

BACKGROUND OF THE INVENTION

1. Field of the Invention

The present invention relates to a technique analyzing impurity distribution and surface shape of a semiconductor specimen.

2. Discussion of the Background

As one of methods analyzing impurity distribution, there is a SCM (Scanning Capacitance Microscopy) measurement that is disclosed to "J. of Elec. Mat. Vol25, No2, p301, 1996".

FIG. 34 is a block diagram showing overall configuration of a conventional SCM measuring apparatus 1. The SCM measuring apparatus 1 in FIG. 34 comprises a stage 11 on which a specimen 16 is placed, XY scanning circuit 12 that scans the stage 11 in the XY direction, a control circuit 13 that controls XY scanning circuit 12, data storing section 14 in which measuring data, control data and the like are stored, a probe 17, a tip 15 of which is contacted on surface of the specimen 16, a sensor 18, and CV measuring apparatus 19.

The signal detected by the probe tip 15 is inputted to the sensor 18 via a cantilever 20, and then amplified. After that, the amplified signal is inputted to the CV measuring apparatus 19 via a UHF transfer line L1.

The SCM measuring apparatus 1 measures the capacitance by the same principle as that of a UHF resonance capacitance sensor. When the probe tip 15 is put on the specimen 16, all of the probe tip 15, the sensor 18, the transfer line L1, and the specimen 16 constitute a part of the resonator. That is, the fluctuation of the capacitance C between the probe tip 15 and the specimen 16 is equivalent to the load, and due to the load, the resonance frequency changes. As a result, with a little change of the resonance frequency, the resonance amplitude changes considerably. By means of this resonator, the sensitivity of attofarads ($10^{-18}$ F) is obtained.

The SCM measuring apparatus 1 in FIG. 34 gives the desired change of the capacitance in the specimen 16 adjacent to the probe tip 15, by supplying the electric field (AC bias of kHz band-width) between the probe tip 15 and the specimen 16.

Free carriers beneath the probe tip 15 is induced or repelled to the probe tip 15 in order to form depletion state or accumulation state. Such depletion state and accumulation state are equivalent to the case changing the distance between the capacitors.

The depth of the depletion layer, that is, the change of the distance between the plates of the capacitor is determined by three factor, that is, i) intensity of supplied electric field; ii) quality and thickness of a dielectric between the probe tip and the measuring object, iii) concentration of the free carriers.

It is assumed that the carrier shields and terminates the supplied electric field. The more intensive the electric field is, or the lower the concentration of the carrier is, the depletion layer is formed until the location deep from the surface. Conversely, the weaker the electric field is, or the higher the concentration of the carrier is, the depletion electric field ends nearby of the surface.

For the specimen that has both of the region with high carrier concentration and the region with low carrier concentration, in case of comparing by the supply voltage with the same level, the region with low carrier concentration has thicker depletion layer.

The SCM measuring apparatus 1 in FIG. 34 measures the moving of the carriers. The lower the carrier concentration is, or the thinner the surface oxidation layer is, the signal with higher signal intensity is outputted. The signal obtained by the SCM measurement is a dC/dV, that is, the change of the capacitance of the depletion layer for the change of the supplied voltage. In the SCM measurement, because the alternating voltage is supplied on the surface of the specimen, the above-mentioned dV may be considered the peak-to-peak voltage. In other words, the above-mentioned dV may be considered a changing amount of all the depletion layer formed beneath the probe tip.

The SCM measuring apparatus 1 of FIG. 34 outputs the relationship between the voltage V supplied on the surface of the specimen and the capacitance C by the form of C–V curve. More specifically, the SCM measuring apparatus 1 converts a modulated component dC of the capacitance in case of supplying a constant voltage amplitude dV to the specimen into a image. Further, the DC bias for the specimen is also capable of adjusting. By adjusting the DC bias, the standard voltage of AC bias changes.

FIG. 35 is a figure showing typical high-frequency CV property of n-type semiconductor. In case of p-type semiconductor, the polarity of the CV property is contrary to FIG. 35. As shown in FIG. 35, when a positive bias voltage is applied to the gate terminal or the probe tip, inversion electrons are induced on the surface of the semiconductor. In the strong inversion state, the total capacitance of the capacitor is equal to that of the dielectric which is usually a oxidation layer.

On the other hands, in case of changing the voltage supplying to the probe tip in the negative direction, the depletion layer enlarges and the capacitance goes down. Further, as the lower the concentration of the carrier is, the more early the depletion layer enlarges, and the capacitance goes down quickly when the voltage changes. That is, the SCM measuring apparatus can regard as a gradient measuring apparatus of the CV property.

By the way, as one method analyzing the surface of the specimen, an AFM (Atomic Force Microscopy) is being known. FIG. 36 is a block diagram showing overall configuration of an AFM measuring apparatus 5. The AFM measuring apparatus 5 in FIG. 36 comprises a probe 21, a piezoelectric element (PZT) 23 on which the specimen 22 is placed, a XY scanning circuit 24 that scans the PZT 23 in the XY direction, a control circuit 25 that controls the XY scanning circuit 24, a data storing apparatus 26 in which measuring data, control data and so on are stored, a servo circuit 27 that controls the PZT 23, a photo-detector 28, a mirror 29, and laser diode 30.

When the distance between the probe tip 31 and the specimen 22 changes within the range of 1 μm–100 Å, the following force works between the probe tip 31 and the specimen 22. Within the distance close to the surface of the specimen, i.e. about 100 Å, an inter-atomic force works mainly. Within the distance of about 3–4 Å from the surface of the specimen, a repulsive force works mainly. Over more than the distance, an attractive force works mainly. On the other hands, at the far distance from the surface of the specimen, an static electricity force due to an electric dipole of the electric charge or the polarity material.

The AFM measuring apparatus 5 in FIG. 36 changes asperity on the surface of the specimen into displaced amount of a cantilever 32, and then detects the displacement amount by using a principle of the optical lever. More specifically, the laser diode 30 rays out the laser for the probe tip 31, and the photodetector 28 detects the reflecting light from the probe tip 31. The servo circuit 27 moves the specimen 22 put on the PZT 23 in up and down direction so that the reflective light aggregates to the center of the photo-detector 28, and the signal moving the PZT 23 in up and down direction is changed into image showing the surface shape of the specimen.

The above-mentioned SCM measuring apparatus 1 in FIG. 34 is capable of analyzing the impurity distribution inside the specimen. The above-mentioned AFM measuring apparatus 5 in FIG. 36 is capable of analyzing the surface shape of the specimen. However, in case of performing the SCM measurement and AFM measurement by using the above-mentioned conventional apparatuses, there are the following problems.

Firstly, because the probe tip has width with about several hundred Å, it is virtually impossible to measure the width smaller than several hundred Å. That is, in case of performing the SCM measurement or the AFM measurement, the resolution is restricted by the width of the probe tip. Further, in case of performing the SCM measurement, the carrier density at the end of the depletion layer inside the specimen is detected by assuming the capacitor plates located in parallel. However, practically, because the shape of the probe tip does not have enough width being able to assume as the plate, the deviation occurs in case of assuming the end of the depletion layer in the specimen as the parallel plate.

SUMMARY OF THE INVENTION

The purpose of the present invention is to provide a semiconductor evaluation apparatus and a semiconductor fabrication system capable of accurately analyzing the impurity distribution inside the specimen and the shape on the surface of the specimen.

To achieve the above-mentioned object, the present invention provides a semiconductor evaluation apparatus comprising SCM measuring means for measuring CV property showing a relationship between a capacitance C between a probe tip and a specimen, and a voltage V supplied to the specimen via the probe tip, comprising:

probe shape adjusting means for adjusting shape data of the probe tip inputted in advance based on the result measuring the CV property of a standard specimen having impurity distribution already known;

SCM simulation means for determining the impurity distribution inside the measuring specimen on the basis of a result comparing the CV property of the measuring specimen calculated based on the shape data of said adjusted probe tip with the CV property of the measuring specimen measured by said SCM measuring means.

Further, the present invention provides a semiconductor evaluation apparatus comprising AFM measuring means for analyzing surface shape of a specimen based on a force working between the specimen and a probe tip placed above the specimen, comprising:

probe shape adjusting means for adjusting shape data of the probe tip inputted in advance based on the result measuring the surface shape of the standard specimen by said AFM measuring means;

AFM simulation means for determining the surface shape of the measuring specimen based on a result comparing the surface shape of the measuring specimen calculated by using the shape data of the adjusted probe tip with the surface shape of the measuring specimen measured by said AFM measuring means.

Because the present invention detects the impurity distribution inside the measuring specimen and the surface shape of the measuring specimen, it is possible to analyze the impurity distribution and the surface shape with precision smaller than the width of the probe tip. By incorporating such a analyzing method in the semiconductor fabrication system, it is possible to decrease the defective rate of the semiconductor apparatus and shorten time necessary to perform a defective analysis.

BRIEF DESCRIPTIONS OF THE DRAWINGS

DETAILED DESCRIPTION OF THE PREFERRED EMBODIMENTS

Referring now to the accompanying drawings, preferred embodiments of a semiconductor evaluation apparatus and a semiconductor fabrication system according to the present invention will be described in detail below.

First Embodiment

Figure 1:
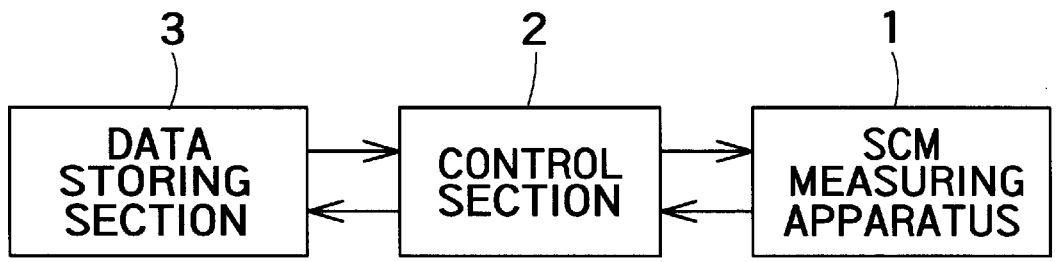
FIG. 1 is a schematic block diagram of a first embodiment.
Figure 34:
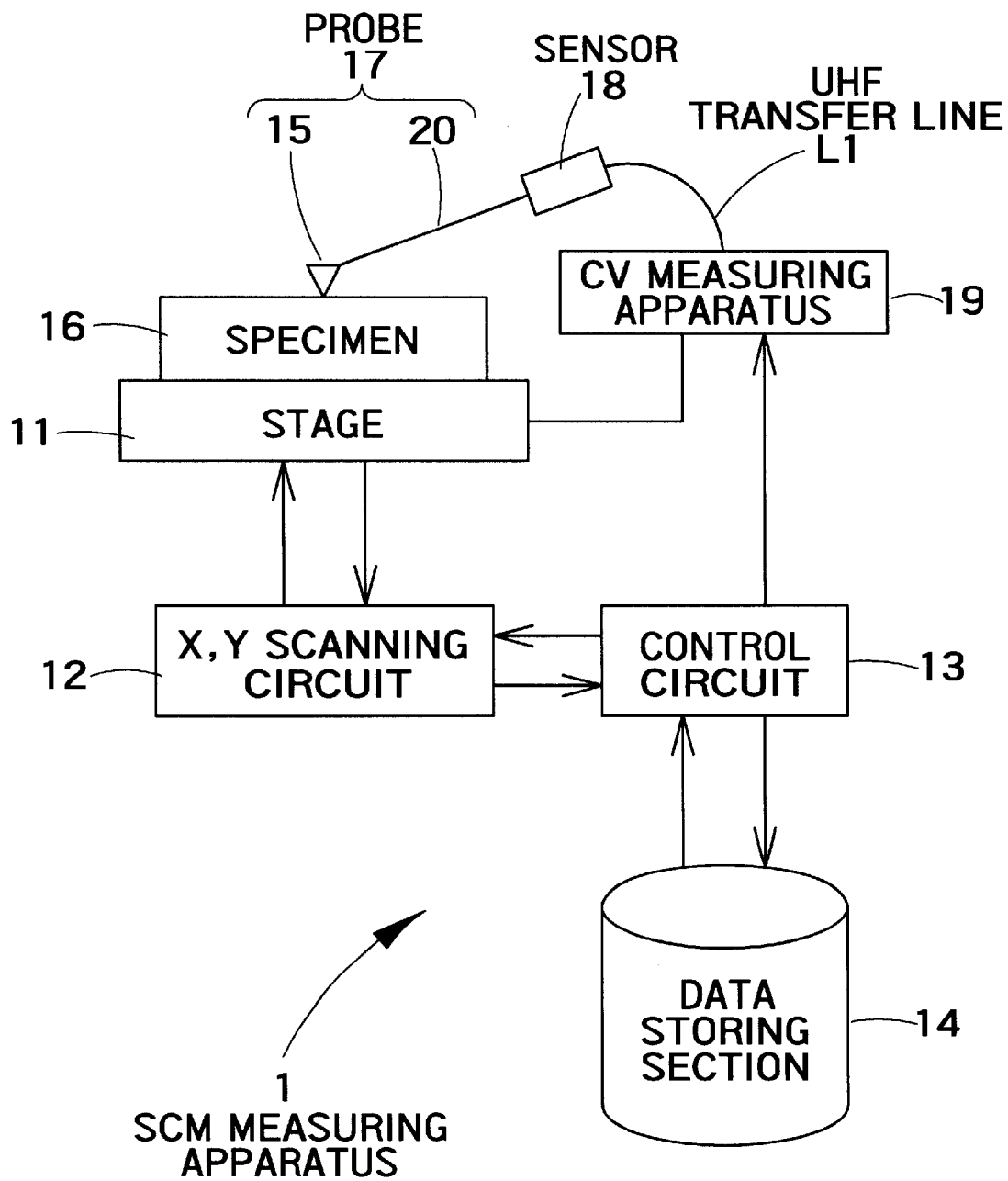
FIG. 34 is block diagram showing overall configuration of conventional SCM measuring apparatus.
Figure 35:
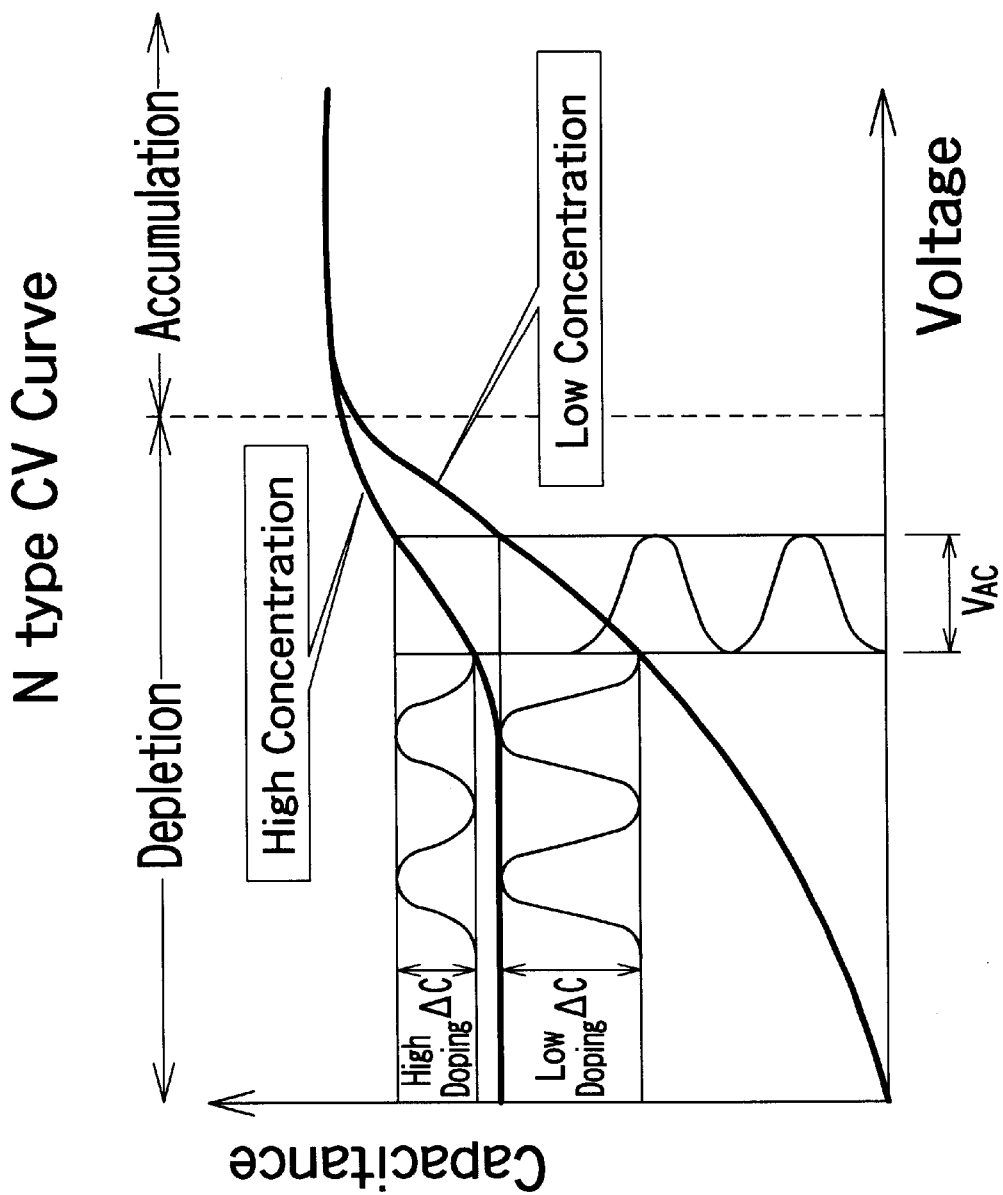
FIG. 35 is a diagram showing typical high-frequency CV property of n-type semiconductor.
Figure 36:
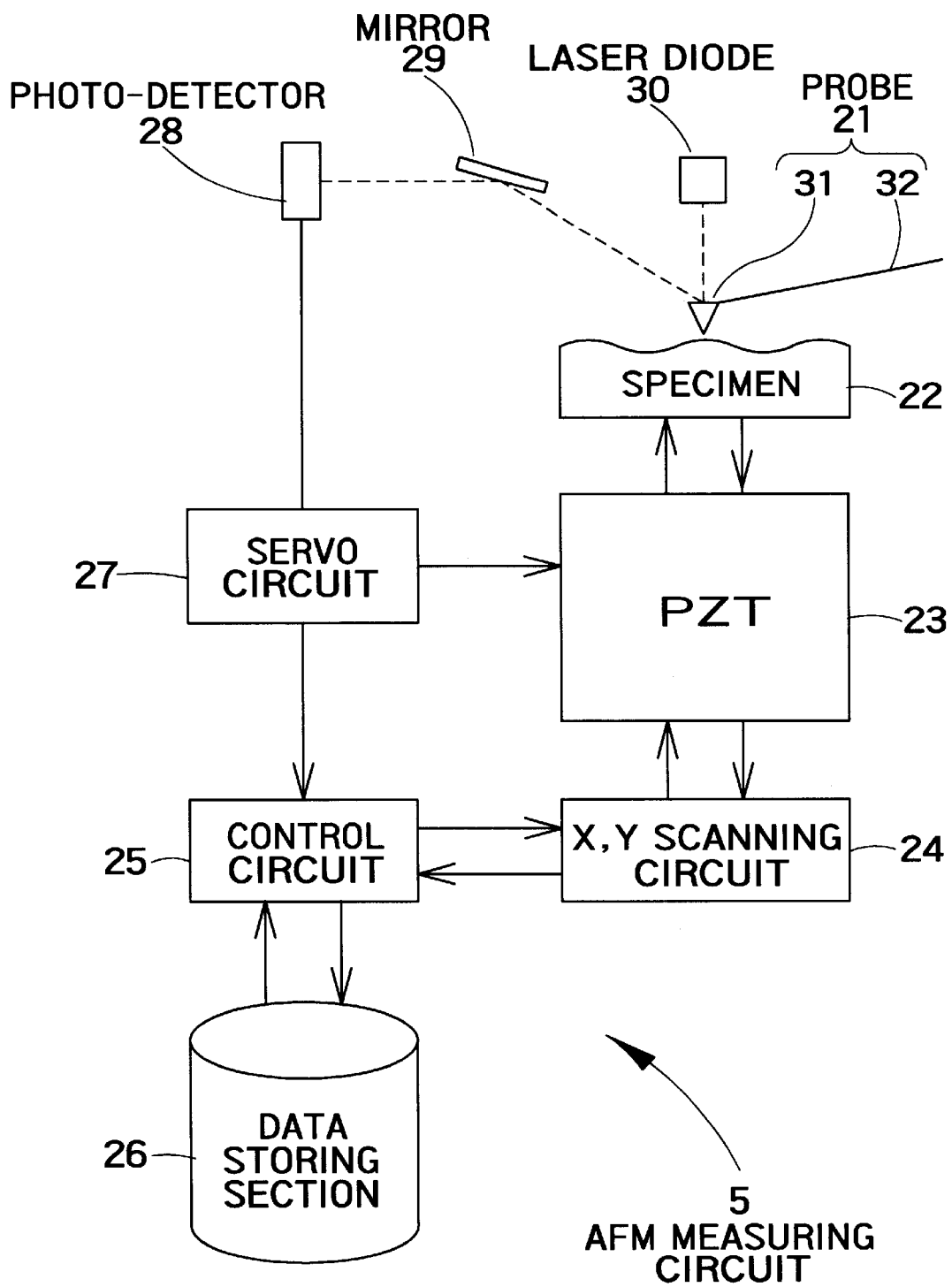
FIG. 36 is a block diagram showing overall configuration of conventional AFM measuring apparatus.

FIG. 1 is a schematic block diagram of a first embodiment according to the present invention. A semiconductor evaluation apparatus in FIG. 1 comprises a SCM measuring apparatus 1 having the same configuration as that of the apparatus in FIG. 34, a control section 2 that controls the SCM measuring apparatus 1, a data storing section 3 in which data measured by the SCM measuring apparatus 1, control data to control the control section 2 and so on are stored.

Figure 2:
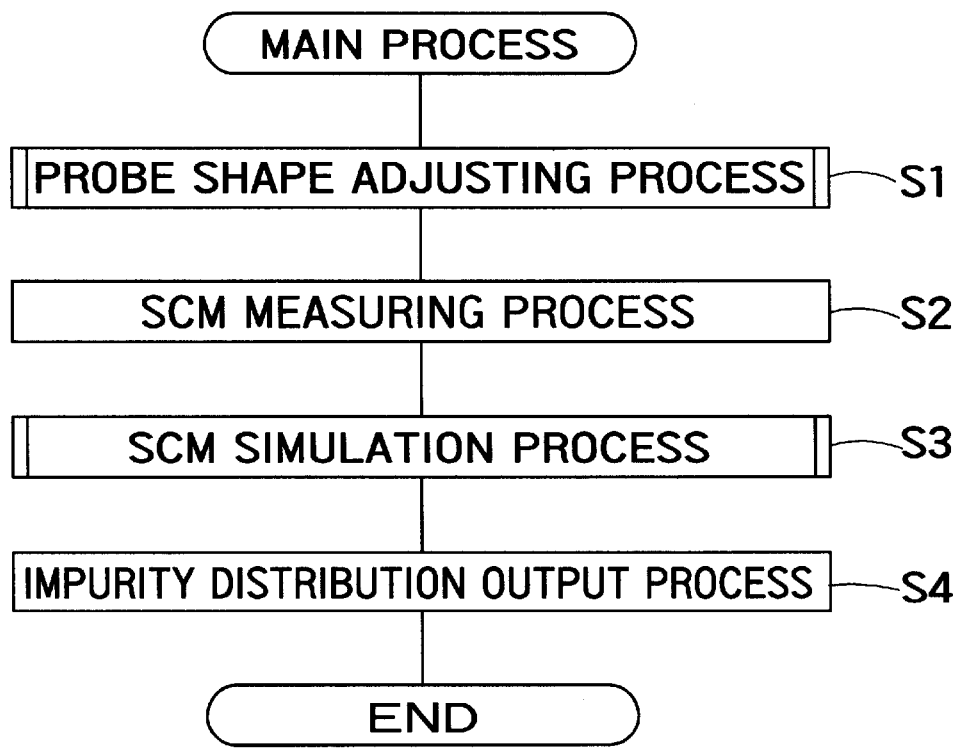
FIG. 2 is a flowchart showing main process performed by the control section.

FIG. 2 is a flowchart showing main process performed by the control section 2. In step S1 in FIG. 2, a process adjusting the probe shape is performed. This process adjusts the shape data of the probe tip inputted in advance based on the result performing the SCM measurement for the standard specimen. The adjusted data is used by after-mentioned SCM simulation process. The process adjusting the probe shape is latterly explained in detail.

Figure 4:
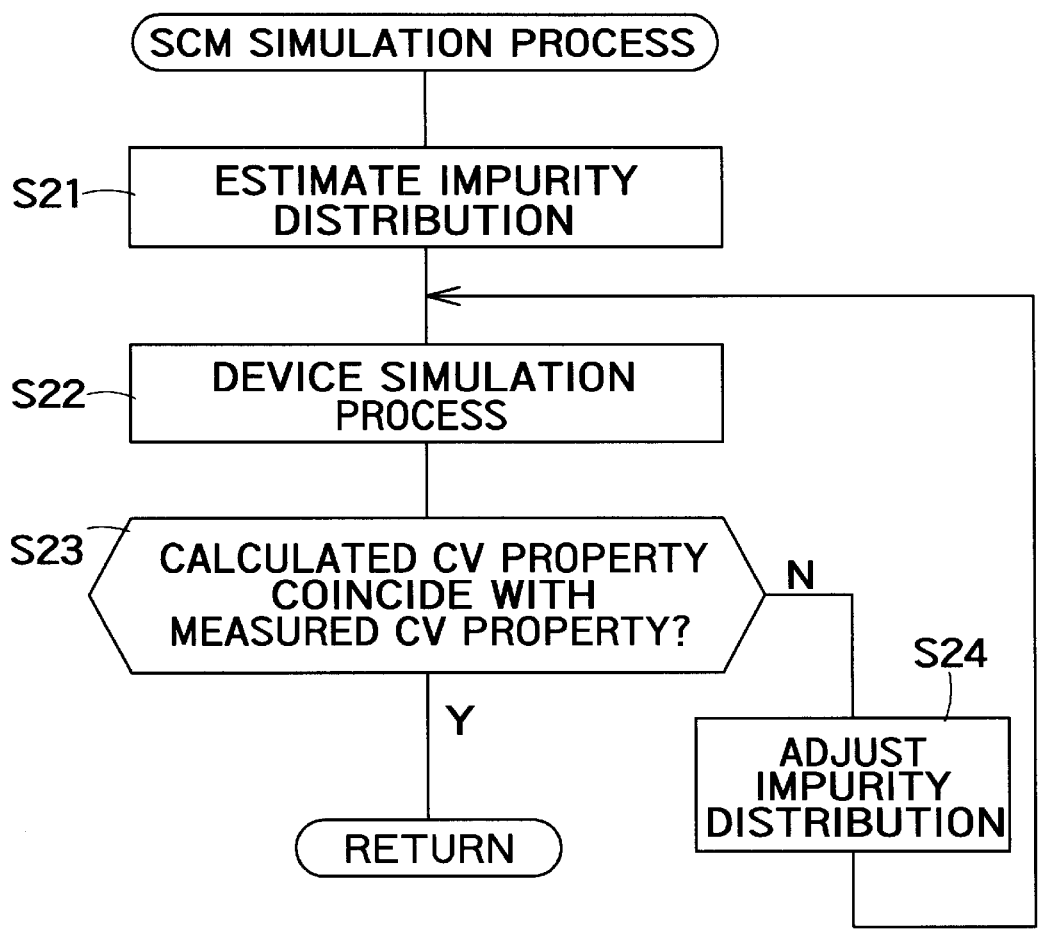
FIG. 4 is a flowchart showing in detail the SCM simulation process of step S3 in FIG. 2.
Figure 5:
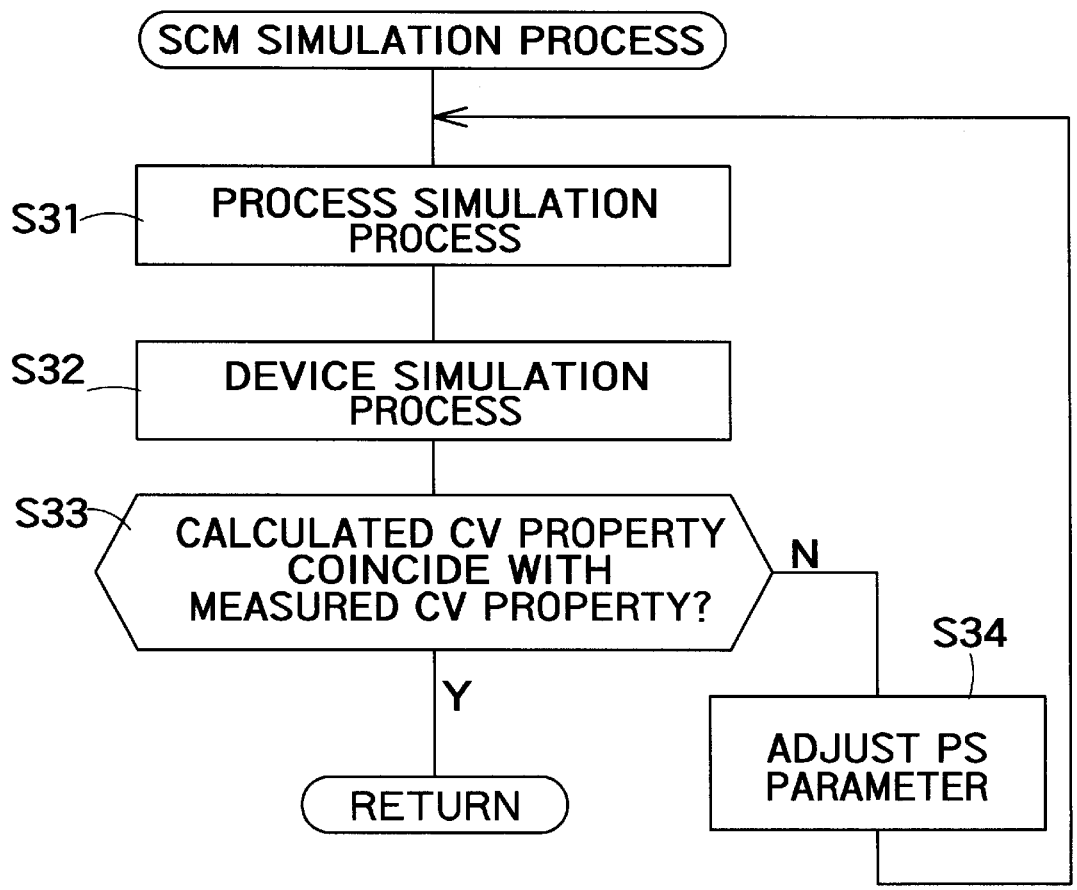
FIG. 5 is a flowchart showing a different example in FIG. 4.

Next, in step S2 of FIG. 2, the SCM measurement is performed by using the SCM measuring apparatus 1 in order to detect the CV property of the measuring specimen. In step S3, the SCM simulation process showing the detail configuration in FIG. 4 and FIG. 5 is performed. This process calculates the CV property of the measuring specimen based on the impurity distribution assumed on the basis of the result measured by the SCM measuring apparatus 1, and then adjusts the impurity distribution so that the calculated CV property becomes equal to the CV property obtained by the SCM measurement. Next, in step S4, the adjusted impurity distribution is changed into image data or numerical data, and then the data is outputted to an unshown display apparatus, a printer or the like.

Next, thereinafter, the process adjusting the probe shape of step S1 in FIG. 1 will be explained in detail on the basis of flowchart in FIG. 3.

In step S11, the SCM measurement is performed for the standard specimen with impurity distribution already known. Next, in step S12, initial shape data correspondent to the probe tip is inputted.

Next, in step S13, a device simulation process is performed. This process solves a Poisson equation and current continuity equations for electrons and holes by using input parameters, i.e. the shape of the probe tip, the shape of the standard specimen, the impurity concentration inside the standard specimen, and the supply voltage V. By solving these equations, the potential distributions inside the probe tip, inside the standard specimen, and in the space between the probe tip and the standard specimen are calculated, respectively, and carrier (electron or/and hole) concentration distribution inside the standard specimen is also calculated. Further, the capacitance C between the probe tip and the standard specimen is also calculated based on the change per time of the carrier concentration distribution.

Thus, the device simulation process calculates the CV property between the probe tip and the standard specimen based on the shape data of the probe tip, the impurity distribution inside the standard specimen and so on. That is, the SCM measuring process in itself is simulated by the device simulation process.

Figure 3:
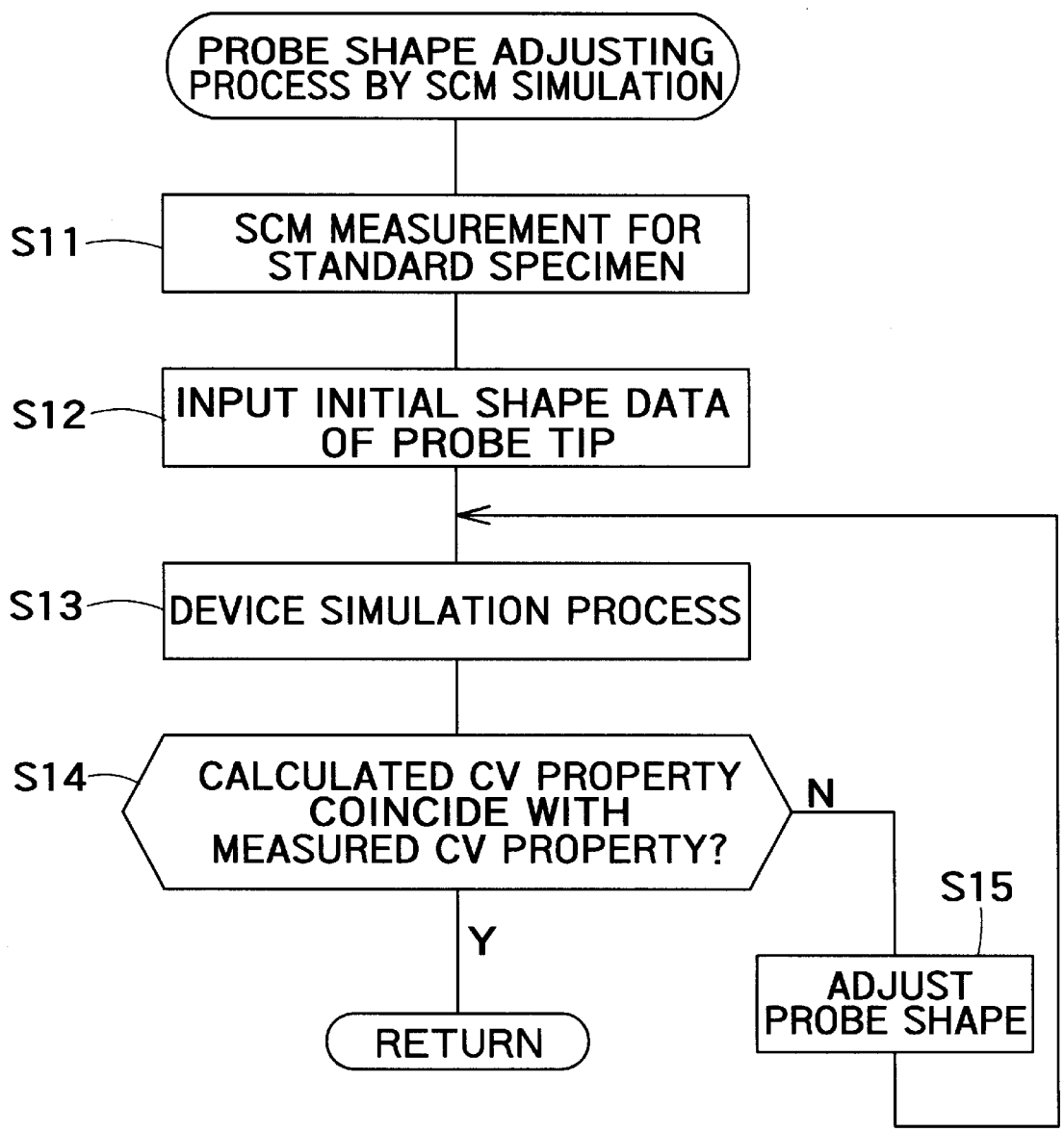
FIG. 3 is a flowchart showing in detail the probe shape adjusting process of step S1 in FIG. 2.

Next, in step S14, the CV property obtained by the device simulation process of step S13 in FIG. 3 is compared with the CV property measured by means of step S11. In case both of the CV properties does not coincide with each other, the probe shape is adjusted by means of step S15. In step S15, numerical differentiation is calculated based on delta of the capacitance C for change of the shape data of the probe tip, and the shape data of the probe tip is adjusted by means of the Newton method. Otherwise, the shape of the probe tip is described by function format, i.e. a spline function, the Fourier series, or the like. For example, the numerical differentiation is calculated based on the delta of the capacitance C for the change of the parameter of the function form, and then on the basis of the calculated result, the shape data of the probe tip is adjusted by means of the Newton method.

On the other hands, in case the compared result of the CV properties coincides, the process adjusting the probe shape is finished and the step S2 of FIG. 2 is performed.

Next, the detail operation of the SCM simulation process showing in step S3 in FIG. 2 will be explained based on the flowchart of FIG. 4. In step S21 in FIG. 4, the impurity distribution Ninit inside the measuring specimen is estimated based on the constant, the charge neutrality, and so on. Next, in step S22, the same device simulation process as that of step S13 of FIG. 3 is performed, that is, the SCM simulation in itself is simulated.

Next, in step S23, the CV property calculated by the device simulation process in step S22 is compared with the CV property measured by the SCM measuring apparatus 1.

If the compared result does not coincide, the impurity distribution is adjusted by means of step S24. In step S24, the impurity distribution is numerically expressed, and numerical differentiation is calculated based on delta of the capacitance C for the change of the numerical impurity distribution. On the basis of the numerical differentiation, the impurity distribution is adjusted by means of the Newton method.

Otherwise, the impurity distribution is described by the function form of the Gauss distribution, the complementary error function, a spline function, the Fourier series, and so on. For example, the numerical differentiation is calculated based on the delta of the capacitance C for the change of the parameter of the function form, and then on the basis of the numerical differentiation, the impurity distribution is adjusted by means of the Newton method.

On the other hands, if the CV property calculated by the device simulation process in step S22 coincides with the CV property measured by SCM measuring apparatus 1, the process of step S4 in FIG. 2 is performed.

FIG. 5 is a flowchart showing a different example of the SCM simulation process in detail. In step S31 in FIG. 5, a process simulation process is performed. This process calculates an initial value of the impurity distribution by initially inputting the fabrication condition. More specifically, for example, the ion implantation energy of the impurity and the dose amount of the impurity are inputted in order to calculate the amount of the ion implantation. Further, the oxidation time and diffusion time are inputted in order to solve the oxidation/diffusion equation; as a result, the impurity distribution inside the measuring specimen is calculated.

Next, in step S32, similar to step S22 in FIG. 4, the device simulation process is performed and the SCM measurement in itself is simulated.

Next, in step S33, the CV property calculated by the device simulation process in step S32 is compared with the CV property obtained by the SCM measuring apparatus 1. If both of the CV properties coincide with each other, the process of step S4 in FIG. 2 is performed. Conversely, both of the CV properties do not coincide with each other, the input parameters (PS; i.e. Process Simulation, parameters) in the process simulation process are adjusted by means of step S34. For example, the numerical differentiation is calculated based on the delta of the CV property for the change of each of the input parameters used by the process simulation process of step S31. On the basis of the calculated result, the adjusting amount of the input parameters, for example, the diffusion temperature, the diffusion time, the amount of the impurity of the ion implantation, the energy of the ion implantation, and so on are determined by means of the Newton method.

Thus, because the first embodiment compares the CV property measured by the SCM measuring apparatus 1 with the CV property calculated on the basis of the measuring result by the SCM measuring apparatus 1, and adjusts the impurity distribution until both of the CV properties coincide with each other, it is possible to detect the impurity distribution with accuracy smaller than the width of the probe tip. Further, because the first embodiment performs the SCM simulation process after adjusting the shape data of the probe tip, the reliability of the simulation is improved.

Second Embodiment

A second embodiment performs again the SCM measurement by changing the measuring conditions in case of being unable to definitively determine the impurity distribution.

Figure 6:
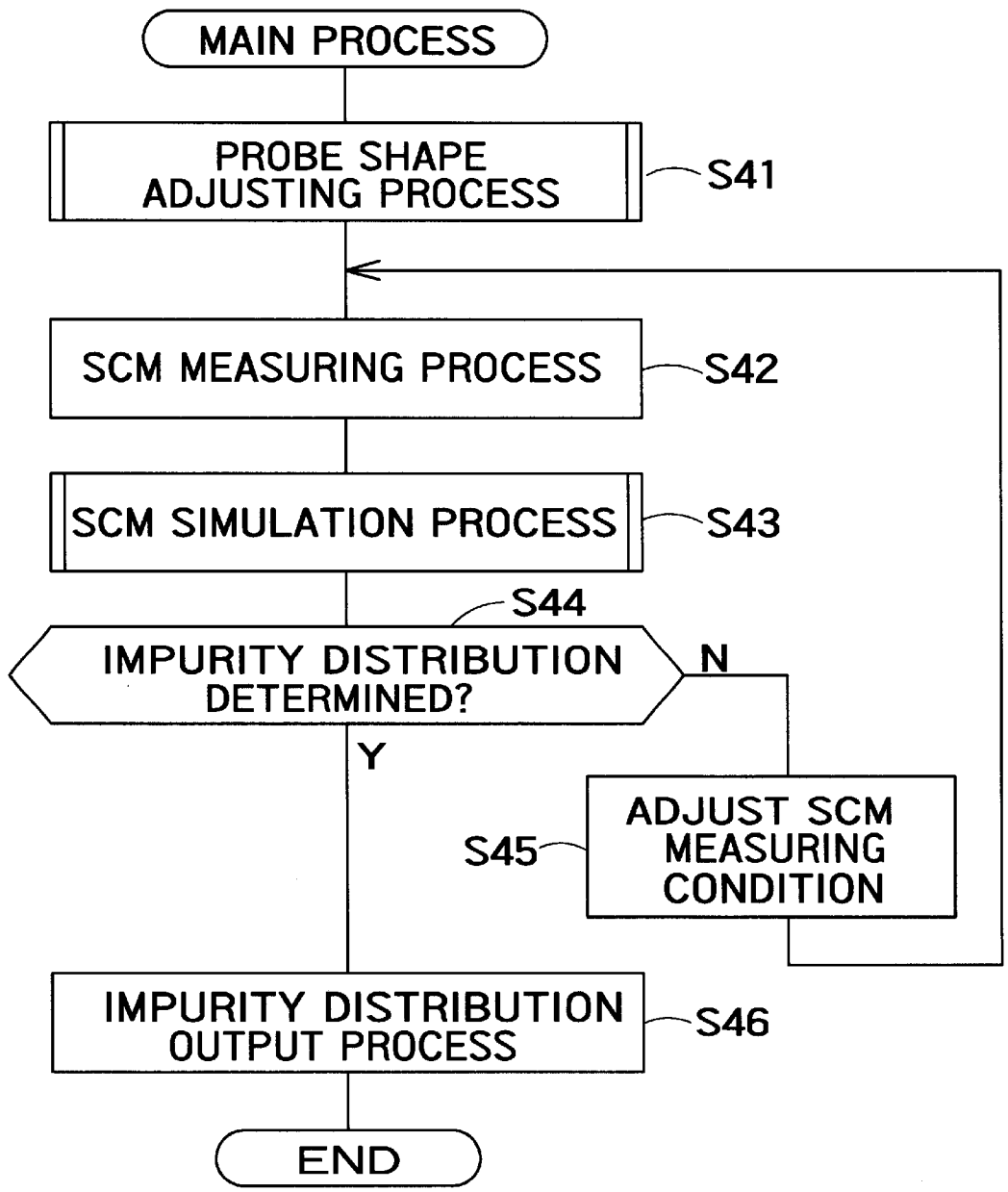
FIG. 6 is a flowchart showing main process performed by the control section in second embodiment of the semiconductor evaluation apparatus.

FIG. 6 is a flowchart showing main process performed by the control section in the second embodiment of the semiconductor evaluation apparatus. Step S41–S43 in FIG. 6 performs the same process as that of step S1–S3 in FIG. 2. In step S44, whether or not it is possible to definitively determine the impurity distribution is judged. That is, in step S44, when the SCM simulation process showing the detail in FIG. 4 and FIG. 5 has been performed, in case a plurality of candidates exits, i.e. in case it is impossible to definitively determine the impurity distribution, decision that it is judged to be unable to determine the impurity distribution.

In case of being unable to definitively determine the impurity distribution, the SCM measuring conditions are adjusted in step S45. In step S45, the measuring conditions on the occasion of the SCM measurement, for example, frequency and voltage, are changed, and then the SCM measurement is performed again in step S42. On the other hands, in case of being able to definitively determine the impurity distribution, the process outputting the definitive impurity distribution to a display apparatus, a printer and so on is performed.

Thus, in the second embodiment, even if performing the SCM simulation process, in case of being unable to definitively determine the impurity distribution, because of performing again the SCM measurement after having changed the measuring condition on the occasion of performing the SCM measurement, it is possible to definitively determine the impurity distribution.

Third Embodiment

A third embodiment adjusts the impurity distribution by performing measurement and simulation of the electric property, after the impurity distribution has been obtained by the SCM simulation process.

Figure 7:
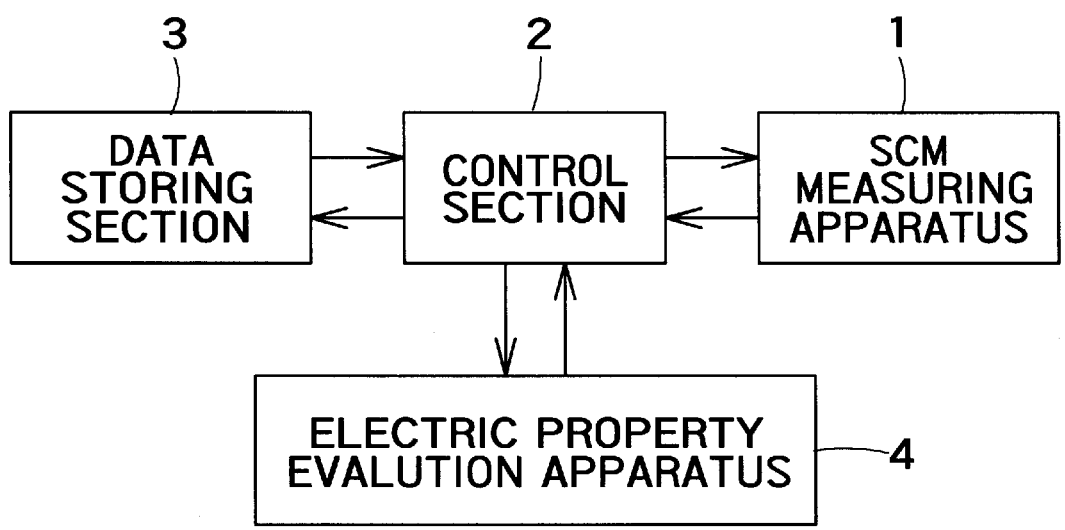
FIG. 7 is a diagram showing schematic configuration in third embodiment of the semiconductor evaluation apparatus.

FIG. 7 is a diagram showing schematic configuration in the third embodiment of the semiconductor evaluation apparatus according to the present invention. The apparatus in FIG. 7 has a feature in which a electric property evaluation apparatus 4 to measure the electric property of the measuring specimen is added anew.

Figure 8:
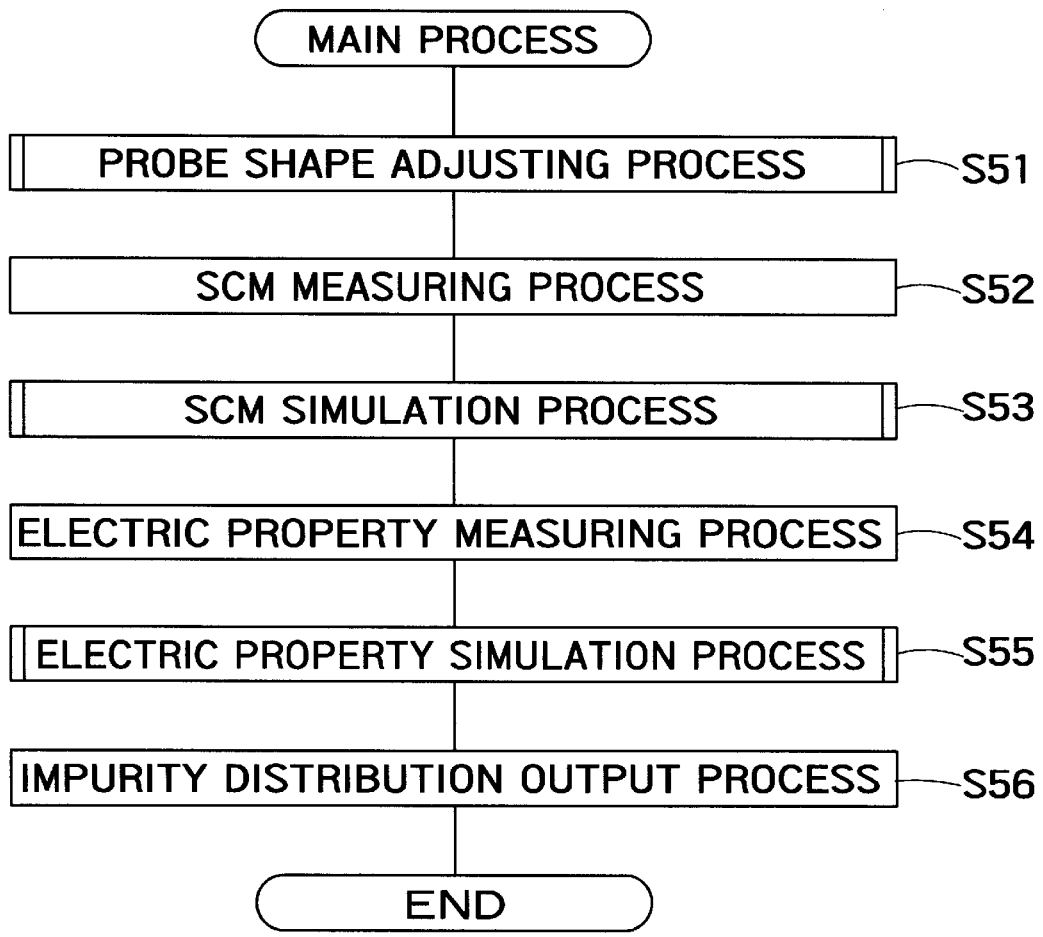
FIG. 8 is a flowchart showing main process performed by the control section in third embodiment of semiconductor evaluation apparatus.

FIG. 8 is a flowchart showing main process performed by the control section in the third embodiment of the semiconductor evaluation apparatus. In step S51–S53 of FIG. 8, the same process as that of step S1–S3 of FIG. 2 is performed. The impurity distribution is calculated by the SCM simulation process of step S53, and then the electric property measuring process is performed by means of step S54. This process measures the electric properties; for example, the capacitance between the gate and the substrate, the capacitance between the gate and the source, the capacitance between the gate and the drain, the threshold voltage, the drain current, the substrate current, the gate current, and so on.

Figure 9:
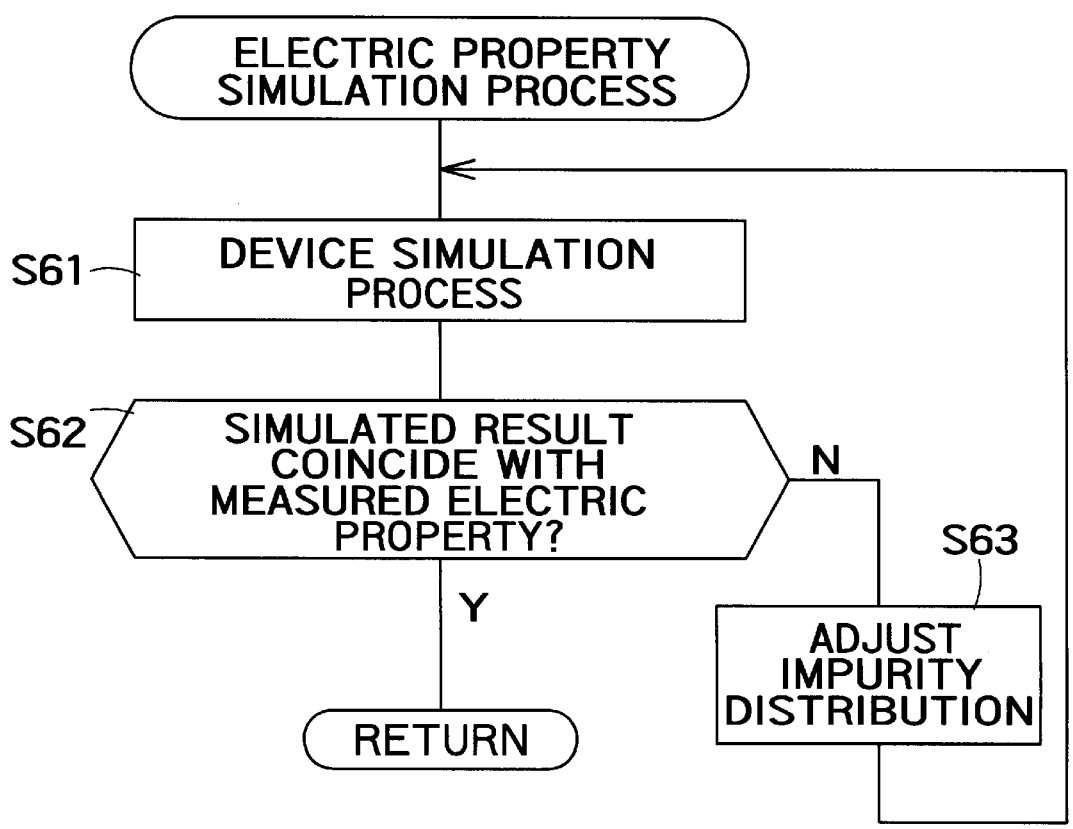
FIG. 9 is a flowchart showing in detail the electric property simulation process of step S55 in FIG. 8.
Figure 10:
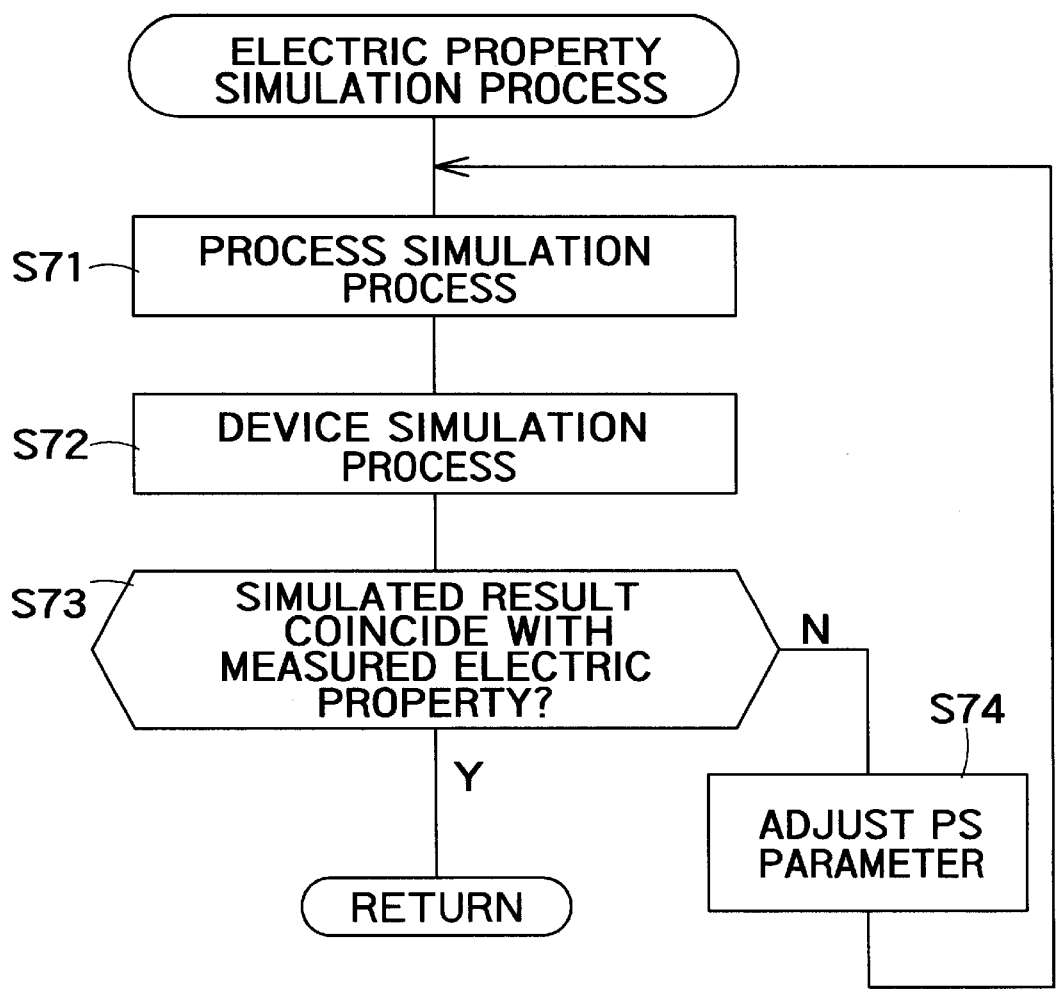
FIG. 10 is a flowchart showing a different example in FIG. 9.

Next, in step S55, an electric property simulation process shown in FIG. 9 and FIG. 10 in detail is performed. This process calculates the high-precision impurity distribution by simulating the electric property in itself. The electric property simulation process will be latterly explained in detail. Next, in step S56, the process outputting the impurity distribution obtained by means of step S55 to the display apparatus, the printer or the like is performed.

Next, the electric property simulation process of step S55 in FIG. 8 will be explained in detail based on the flowchart in FIG. 9. In step S61 in FIG. 9, the device simulation process similar to step S13 in FIG. 3 is performed. By means of the process, the electric property is calculated based on the impurity distribution NSCM obtained by the SCM simulation process of step S53 in FIG. 8.

Next, in step S62, the electric property calculated by means of step S61 in FIG. 8 is compared with the electric property measured by means of step S54. In case both of the measuring value and the calculating value does not coincide with each other, the impurity distribution is adjusted in step S63, and then the device simulation process of step S61 is iterated. Conversely, if both of the measuring value and the calculating value coincide with each other, the impurity distribution is outputted in step S56 in FIG. 8.

FIG. 10 is a flowchart showing a different example of the electric property simulation process in detail. In step S71, similar to step S31 in FIG. 5, the process simulation process is performed. By means of the process, an initial value of the impurity distribution is calculated by initially inputting the fabrication conditions. Next, in step S72, the device simulation process is performed by using the calculated impurity distribution in order to simulate the measurement of the electric property in itself.

Next, in step S73, the electric property calculated by means of the device simulation in step S72 is compared with the electric property measured by means of step S54 in FIG. 8. If both of the electric properties coincide with each other, the process of step S56 is performed. Conversely, both of the electric properties do not coincide with each other, the input parameters (PS; i.e. Process Simulation, parameter) in the process simulation process, for example, the diffusion temperature, the diffusion time and so on are adjusted, and then the simulation process of step S71 is iterated.

Thus, because the third embodiment adjusts the impurity distribution based on the measured value and the simulated result of the electric property after the impurity distribution is obtained by the SCM simulation process, higher-precision impurity distribution is obtained.

Fourth Embodiment

A fourth embodiment adjusts the impurity distribution based on both of the measured result and the simulated result of the electric property only in case the impurity distribution with enough accuracy is not obtained.

Figure 11:
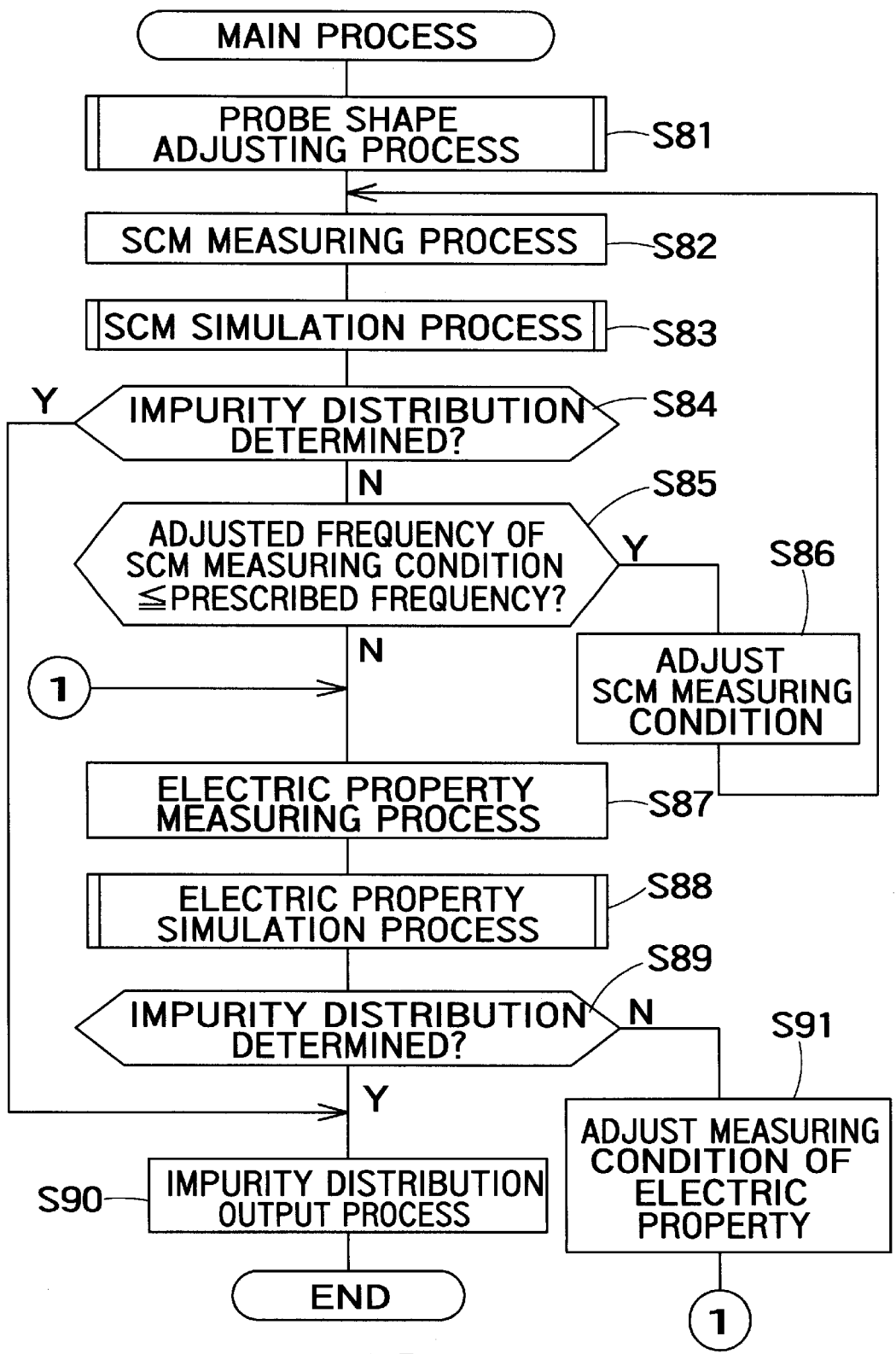
FIG. 11 is a flowchart showing main process performed by the control section in fifth embodiment of semiconductor evaluation apparatus.

FIG. 11 is a flowchart showing the main process performed by the control section in the fourth embodiment of the semiconductor evaluation apparatus. In step S81–S83 in FIG. 11, the same process as that of step S1–S3 in FIG. 2 is performed. Next, in step S84, whether or not the impurity distribution is definitively determined is judged. In case the impurity distribution is definitively determined, the process outputting the impurity distribution is performed in step S90. On the other hands, in case the impurity distribution is not definitively determined, the process of step S85 is performed.

In step S85, whether or not the frequency adjusting the SCM measuring condition are more than prescribed frequency is judged. If the adjusted frequency is less than or equal to the prescribed frequency, the conditions for the SCM measurement, for example, the frequency, the voltage amplitude and so on, is changed in step S86, and then the SCM measuring process of step S82 is performed again. On the other hands, in case the adjusted frequency of the SCM measuring conditions is more than the prescribed frequency, that is, it is impossible to definitively determine the impurity distribution with the frequency within the prescribed frequency by means of the adjustment of the SCM measuring condition, the electric property measuring process and the electric simulation process are performed as explained thereinafter.

Firstly, in step S87, the electric property measuring process is performed. Next, in step S88, the electric property simulation process is performed. This process of step S87 and step S88 is similar to that of step S54 and S55 in FIG. 8.

Next, in step S89, whether or not the impurity distribution is definitively determined is judged. If the definitive impurity is determined, the impurity distribution is outputted in step S90. If the definitive impurity is not definitively determined, the electric property measuring condition is adjusted in step S91. For example, the measuring condition, i.e. the frequency measuring the capacitance C, the supplied voltage, and so on are adjusted, and then the electric property measuring process of step S87 is performed again.

Thus, because the fourth embodiment adjusts the impurity distribution based on the measured result and the simulated result of the electric property, it is possible to shorten the processing time necessary to obtain the definitive impurity distribution.

Fifth Embodiment

A fifth embodiment extracts the surface shape of the specimen with high-accuracy based on the result comparing the surface shape of the measuring specimen calculated by AFM simulation with the surface shape of the measuring specimen measured by the AFM measurement.

Figure 12:
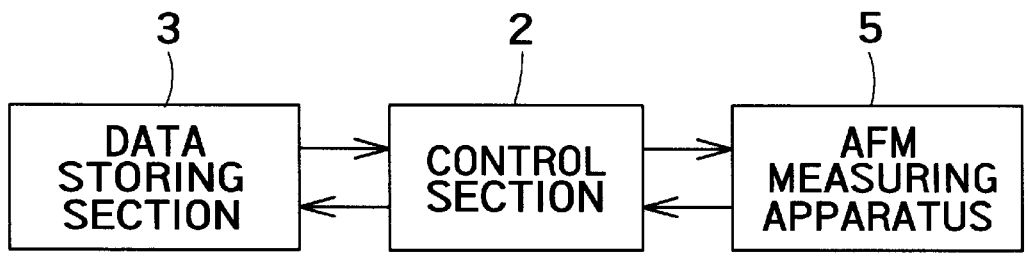
FIG. 12 is a diagram showing schematic configuration in fifth embodiment of semiconductor evaluation apparatus.

FIG. 12 is a diagram showing schematic configuration in the fifth embodiment of the semiconductor evaluation apparatus according to the present invention. The apparatus in FIG. 12 has a feature in which AFM measuring apparatus 5 is provided instead of the SCM measuring apparatus 1.

Figure 13:
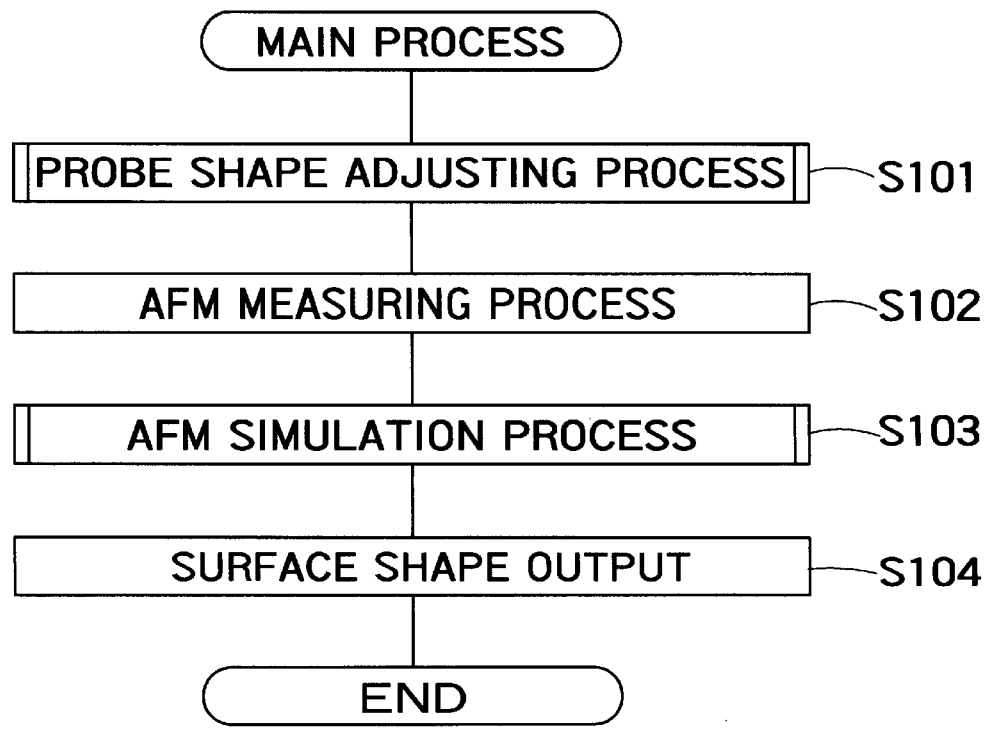
FIG. 13 is a flowchart showing main process performed by the control section in fifth embodiment of semiconductor evaluation apparatus.

FIG. 13 is a flowchart showing the main process performed by the control section in the fifth embodiment of the semiconductor evaluation apparatus. In step S101, the process adjusting the probe shape is performed in order to determine the shape of the probe tip. More specifically, the shape of the probe tip is determined on the basis of the result measured by the AFM measuring apparatus 5 and the result simulating the surface shape of the standard specimen by the AFM measuring apparatus 5.

Next, in step S102, the AFM measuring process by the AFM measuring apparatus 5 is performed, and then the result measuring the surface shape of the measuring specimen is outputted. Next, in step S103, AFM simulation process shown in FIG. 14 or FIG. 15 in detail is performed in order to adjust the surface shape of the measuring specimen. Next, in step S104, the adjusted surface shape is converted into image data or numerical data, and then outputted to the display apparatus, the printer, and so on.

Figure 14:
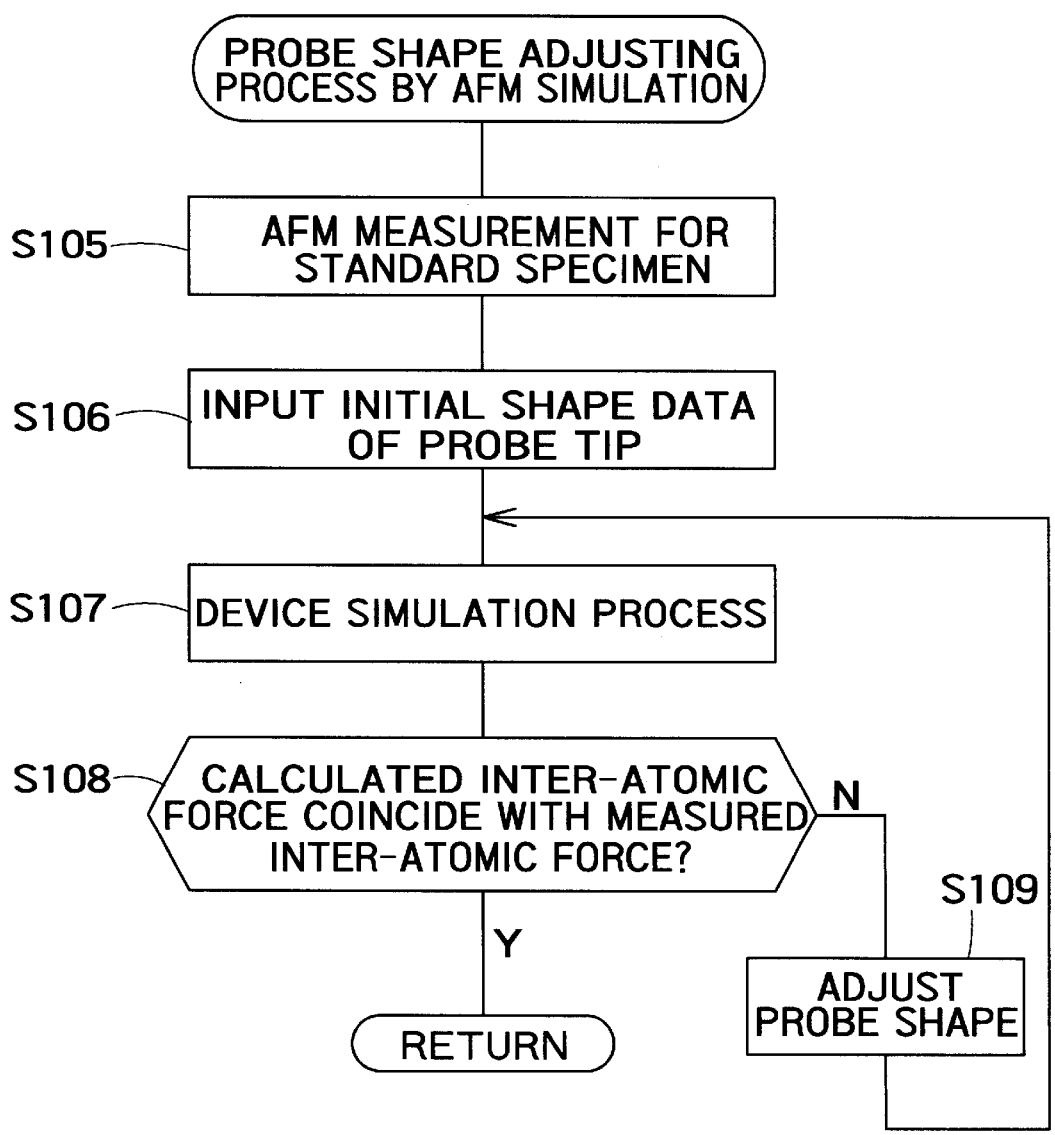
FIG. 14 is a flowchart showing in detail the probe shape adjusting process of step S101 in FIG. 13.

Next, the process adjusting the probe shape of step S101 will be explained on the basis of the flowchart in FIG. 14 in detail. In step S105, the AFM measurement is performed for the standard specimen having the surface shape already known. Next, in the S106, the initial shape data of the probe tip is inputted. Next, in step S107, the device simulation process is performed. This process solves an electromagnetic field equation, i.e. the Poisson equation, the Maxwell equation, or the like, by setting the shape of the probe tip or the surface shape of the standard specimen as input parameters. As the result, the electromagnetic distribution between the probe tip and the standard specimen is calculated, and the force working between the probe tip and the standard specimen (inter-atomic force) is calculated.

Thus, the device simulation process calculates the inter-atomic force between the probe tip and the surface of the standard specimen based on the surface distribution of the standard specimen and so on. That is, the simulation for the AFM measurement in step S105 in itself is performed.

Next, in step S108, the inter-atomic force obtained by the AFM simulation of step S107 is compared with the inter-atomic force measured by means of step S105. In case both the inter-atomic forces do not coincide with each other, the probe shape is adjusted in step S109. On the basis of the delta of the inter-atomic force for the change of the shape data of the probe tip, the numerical differentiation is calculated, and then the shape data of the probe tip is adjusted by means of the Newton method. Otherwise, the shape of the probe tip is described with the function format, i.e. the spline function, the Fourier series, or the like. And then, for example on the basis of the delta of the inter-atomic force for the change of the parameter of the function format, the numerical differentiation is calculated, and then the shape data of the probe tip is adjusted by means of the Newton method.

On the other hands, in step S108, in case the result comparing with both the inter-atomic forces is equal, the process adjusting the shape of the probe tip is finished, and then the process of step S102 in FIG. 13 is performed.

Next, the AFM simulation process of step S103 will be explained based on the flowchart of FIG. 15 in detail. In step S111 in FIG. 15, similar to step S107 in FIG. 14, the device simulation process is performed in order to simulate the AFM measurement in itself.

Next, in step S112, the surface shape of the measuring specimen calculated by the AFM simulation in step S111 is compared with the surface shape measured by means of the AFM measurement in step S102. If both of the surface shapes coincide, the process of step S104 in FIG. 13 is performed. Conversely, if both of the surface shapes do not coincide, the surface shape of the measuring specimen is adjusted in step S113. More specifically, the surface shape of the measuring specimen is numerically expressed. For example, the numerical differentiation is calculated based on the changing amount of the inter-atomic force calculated by means of the device simulation process for the change of the numerical value. On the basis of the numerical specimen, the input parameters used by the device simulation process is adjusted by means of the Newton method.

Figure 16:
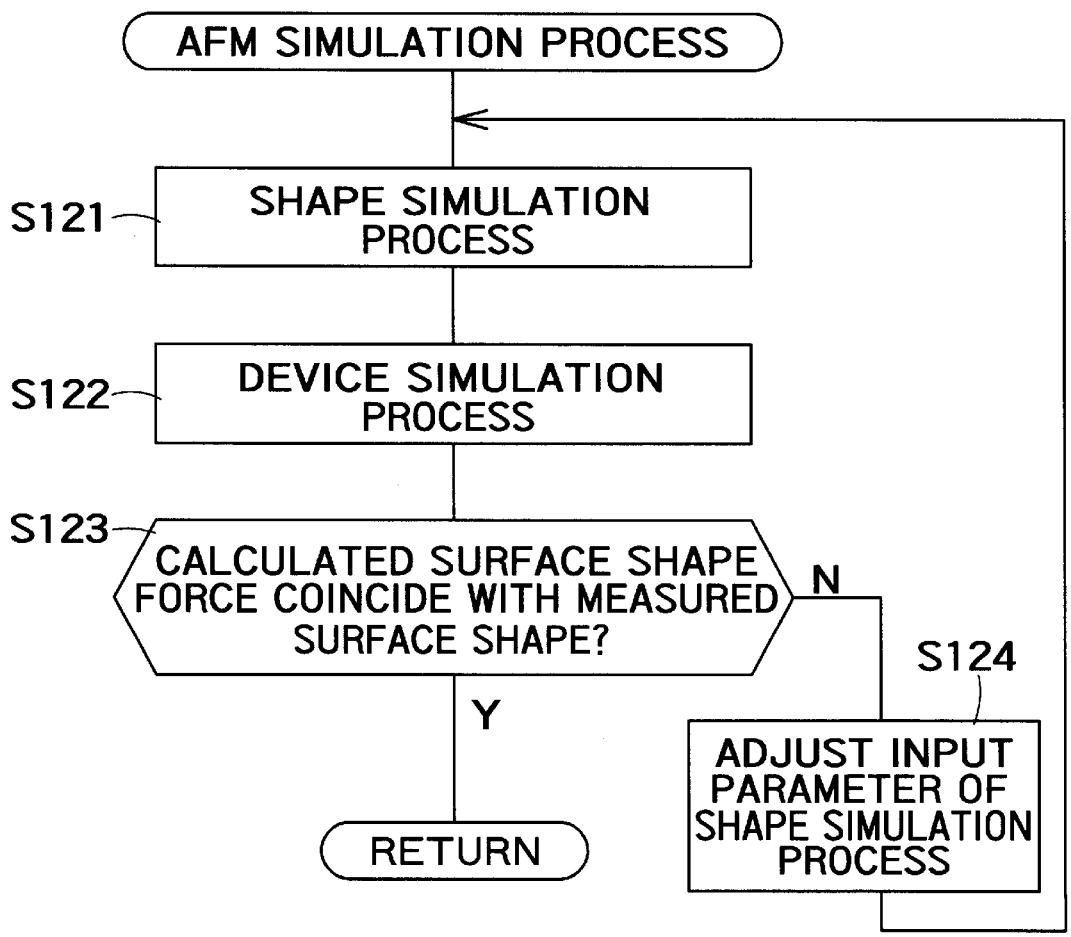
FIG. 16 is a flowchart showing a different example in FIG. 15.

FIG. 16 is a flowchart showing a different example of the AFM simulation process in detail. In step S121, a shape simulation process is performed. The shape simulation process calculates data related to the surface shape of the measuring specimen by initially inputting the fabrication condition. Next, in step S122, the device simulation process is performed by using the result of step S121 in order to calculate the surface shape of the measuring specimen.

Figure 15:
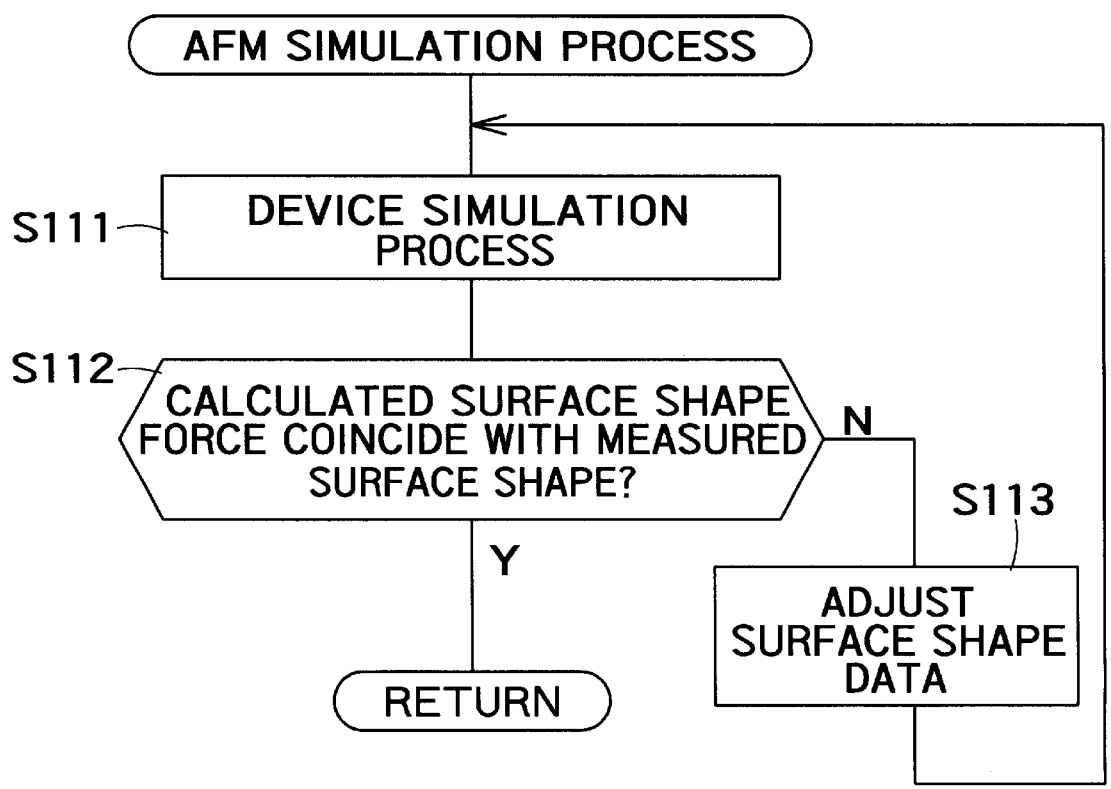
FIG. 15 is a flowchart showing in detail the AFM simulation process of step S103 in FIG. 13.

In step S123, similar to step S112 of FIG. 15, the surface shape calculated by the device simulation process in step S122 is compared with the surface shape measured by the AFM measurement. In case the compared shapes coincides, the process of step S104 in FIG. 13 is performed. Conversely, in case the compared shapes does not coincide, the input parameters used by the shape simulation process are adjusted in step S124. More specifically, for example, the numerical differentiation is calculated based on the delta of the inter-atomic force, and then the adjusting amount of the input parameters is determined by means of the Newton method. And then the shape simulation process is performed again by using the adjusted parameters.

Thus, because the fifth embodiment adjusts the surface shape of the specimen measured by the AFM measurement based on the surface shape of the specimen calculated by the simulation, it is possible to detect the surface shape of the specimen with accuracy smaller than the width of the probe tip.

Sixth Embodiment

A sixth embodiment judges whether or not the surface shape of the measuring specimen is definitively determined by means of the AFM simulation process.

Figure 17:
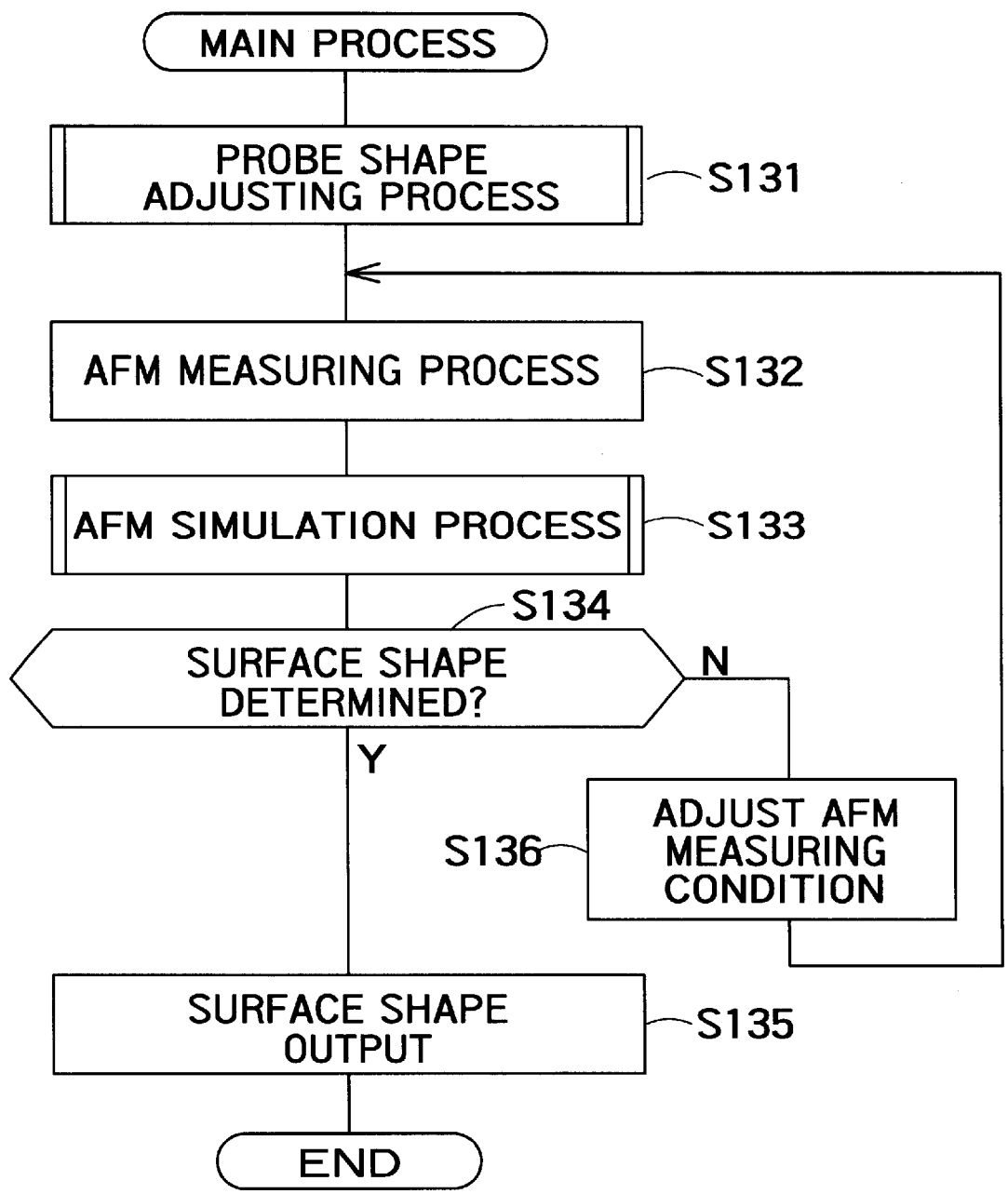
FIG. 17 is a flowchart showing main process performed by the control section in sixth example of semiconductor evaluation apparatus.

FIG. 17 is a flowchart showing the main process performed by the control section in the sixth embodiment of the semiconductor evaluation apparatus. In step S131–S133 in FIG. 17, the same process as that of step S101–S103 is performed. In step S134, whether or not it is possible to definitively determine the surface shape of the measuring specimen is judged. That is, in step S134, when the AFM simulation process showing a detail in FIG. 15 and FIG. 16 is performed, in case a plurality of candidates exist because of being unable to restrict to one candidate, it is judged that the surface shape is unable to be definitively determined.

In case the surface shape can be definitively determined, the process outputting to the printer and so on is performed in step S135. On the other hands, in case the surface shape can not be definitively determined, the AFM measuring condition is adjusted in step S136. For example, after the measuring conditions, for example, the distance between the probe tip and the specimen, and the velocity allowing the specimen to move, are changed, the AFM measuring process is performed again in step S132.

Thus, in the sixth embodiment, in case the surface shape of the measuring specimen can not be definitively determined, the AFM measuring condition is changed, and then the AFM measurement is performed again. Accordingly, even if a plurality of candidates for the surface shape exist, it is possible to definitively select the adequate surface shape.

Seventh Embodiment

A seventh embodiment performs the process combining the AFM measurement with the SCM measurement, and in case it is determined that the surface shape of the measuring specimen is flat by means of the AFM measurement, the AFM simulation process is omitted.

Figure 18:
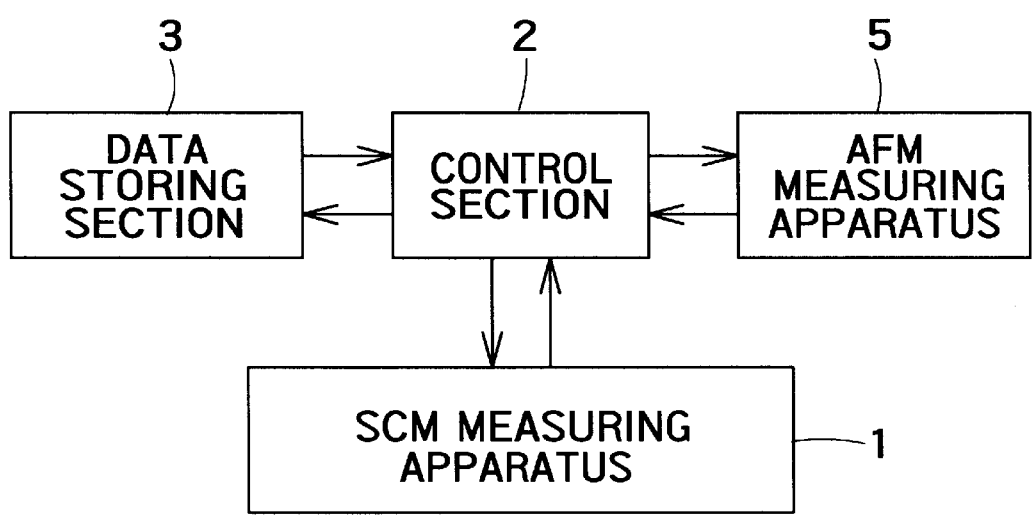
FIG. 18 is a diagram showing schematic configuration in seventh embodiment of semiconductor evaluation apparatus.

FIG. 18 is a diagram showing schematic configuration in the seventh embodiment of the semiconductor evaluation apparatus according to the present invention. The apparatus in FIG. 18 has a feature in which both of the SCM measuring apparatus 1 and the AFM measuring apparatus 5 are provided.

Figure 19:
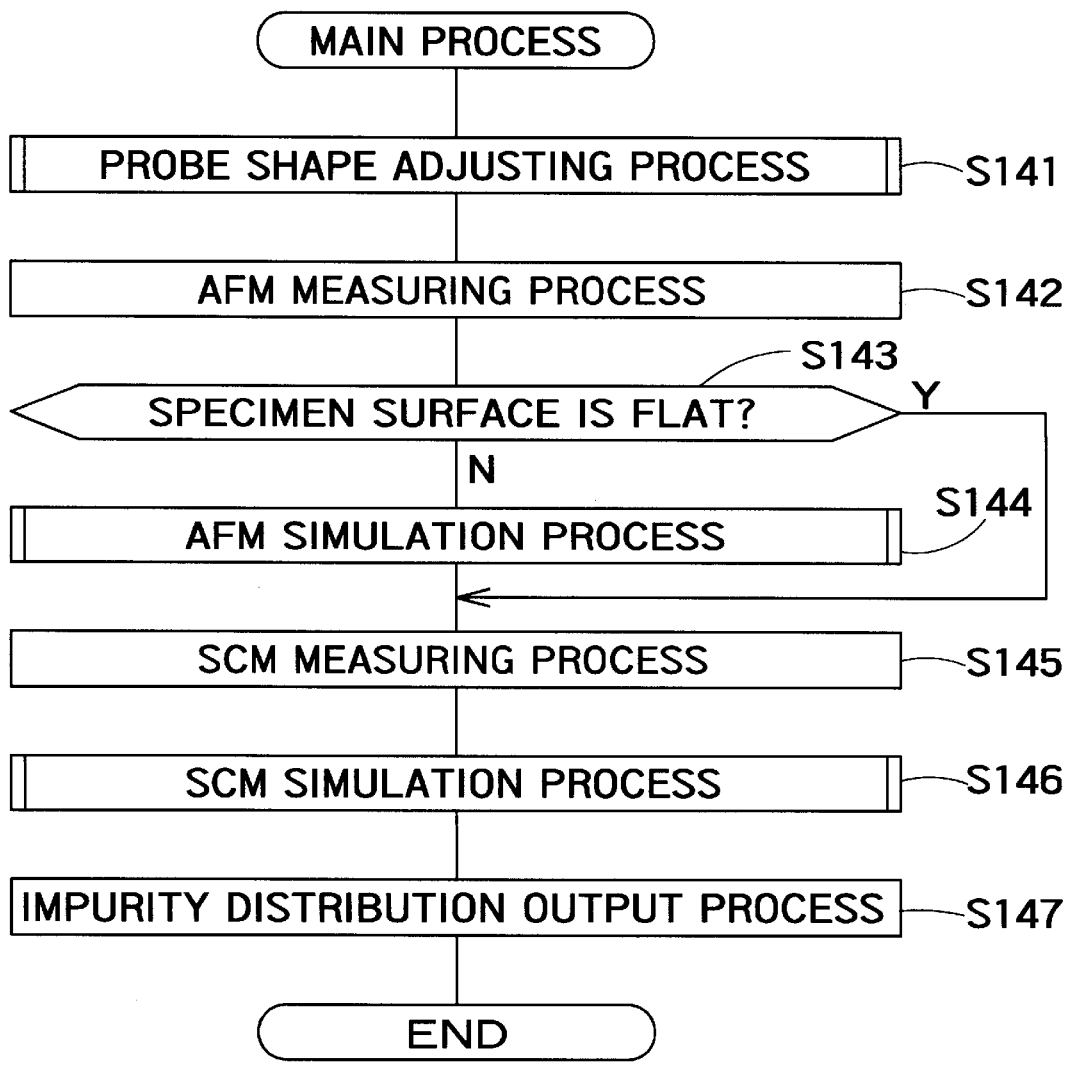
FIG. 19 is a flowchart showing main process performed by the control section in seventh embodiment of semiconductor evaluation apparatus.

FIG. 19 is a flowchart showing the main process performed by the control section in the seventh embodiment of the semiconductor evaluation apparatus. In step S141 and S142 in FIG. 19, the same process as that of step S101 and S102 in FIG. 13 is performed. In the process adjusting the probe shape, besides the method using the standard specimen for the AFM measurement, it is possible to adjust by using the SCM standard specimen of step S1 in FIG. 2.

In step S143 in FIG. 19, on the basis of the result measuring the surface shape by means of the AFM measuring apparatus 5, whether or not the surface of the measuring specimen is flat is judged. If the surface of the measuring specimen is not flat, the AFM simulation process showing a detail in FIG. 15 or FIG. 16 is performed in step S144. Conversely, if the surface of the measuring specimen is flat, the AFM simulation process is omitted, and then the process of step S135 is performed.

As the basis to determine whether or not the surface of the measuring specimen is flat, for example, if square root of product of the height of the surface asperity of the measuring specimen and the gap is smaller than the resolution of the probe, it is determined to be flat.

Thereafter, in step S145–S147, similar to step S2–S4 in FIG. 2, the impurity distribution measured by the SCM measuring apparatus 1 is adjusted by the SCM simulation process.

Thus, because the seventh embodiment performs the SCM simulation process in consideration of the surface of the measuring specimen based on the AFM measurement and the AFM simulation, in case the surface is not flat, it is possible to high-accurately analyze the impurity distribution.

Eighth Embodiment

A eighth embodiment performs the process combining the AFM measurement with the SCM measurement, and in case it is impossible to definitively determine the simulated result in each measurement, the measurement is performed again by changing the measuring condition.

Figure 20:
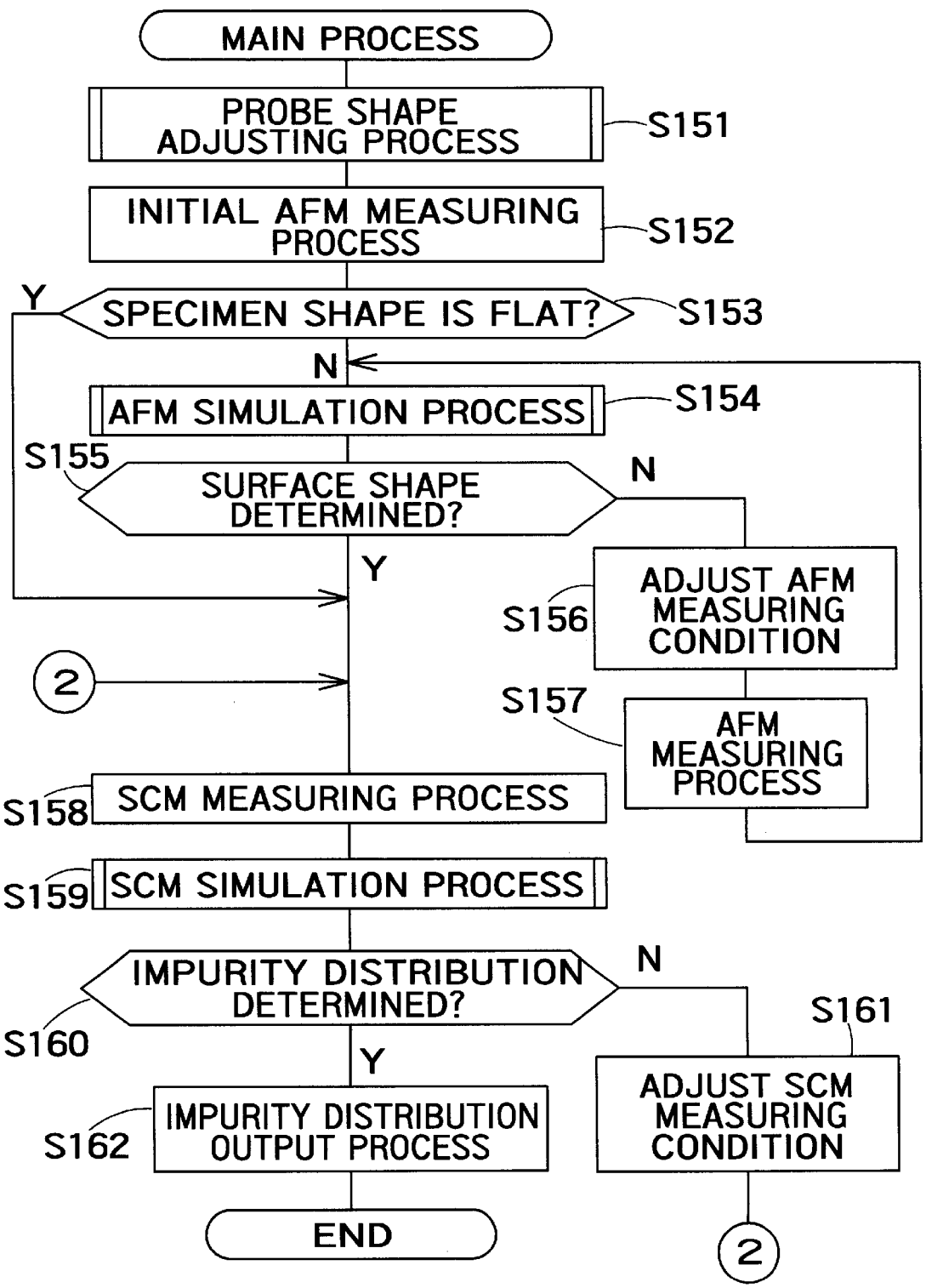
FIG. 20 is a flowchart showing main process performed by the control section in eighth embodiment of semiconductor evaluation apparatus.

FIG. 20 is a flowchart showing the main process performed by the control section in the eighth embodiment of the semiconductor evaluation apparatus. In step S151 in FIG. 20, similar to step S101 in FIG. 13, the process adjusting the probe shape is performed. Otherwise, the adjustment of the probe shape may be performed by using the SCM standard specimen. Next, in step S152, the initial AFM measuring process is performed. This process measures the surface shape of the measuring specimen by means of the AFM measuring apparatus 5.

Next, in step S153, whether or not the surface of the measuring specimen is flat is judged. If the surface of the measuring specimen is not flat, the AFM simulation process showing a detail in FIG. 15 or FIG. 16 is performed. Next, in step S155, whether or not the surface shape of the measuring specimen is definitively determined is judged. If it is impossible to definitively determine the surface shape, the measuring conditions, for example, the distance between the probe tip and the specimen, the scanning velocity of the specimen, or the like, are changed in step S156, and then the AFM measurement by means of the AFM measuring apparatus 5 is performed in step S157. Next, on the basis of the measured result, the AFM simulation process in step S154 is performed again.

On the other hands, in case it is determined that the surface is flat, or in case it is possible to definitively determine the surface shape in step S155, the SCM measurement by the SCM measuring apparatus 1 is performed in step S158 in order to detect the impurity distribution in the measuring specimen. Next, in step S159, the SCM simulation process showing a detail in FIG. 4 or FIG. 5 is performed in order to detect the impurity distribution with high-accuracy.

Next, in step S160, whether or not it is possible to definitively determine the impurity distribution by means of the SCM simulation process is judged. If it is impossible to definitively determine the impurity distribution, the measuring conditions for the SCM measurement, for example, the frequency, the voltage amplitude, and so on, are adjusted, and then the SCM measuring process is performed again in step S158. On the other hands, in case it is possible to definitively determine the impurity distribution, the process outputting the impurity distribution and the surface shape to the display apparatus, the printer and so on is performed.

Thus, the eighth embodiment, in case it is impossible to definitively determine the surface shape even if performing the AFM simulation process, performs again the AFM measurement by changing the measuring conditions, and in case it is impossible to definitively determine the surface shape even if performing the SCM simulation process, performs again the SCM measurement by changing the measuring conditions. Accordingly, it is possible to high-accurately detect the surface shape of the measuring specimen and the impurity distribution inside the measuring specimen.

Ninth Embodiment

A ninth embodiment adjusts the impurity distribution on the basis of the result comparing the measured result of the electric property with the simulated result.

Figure 21:
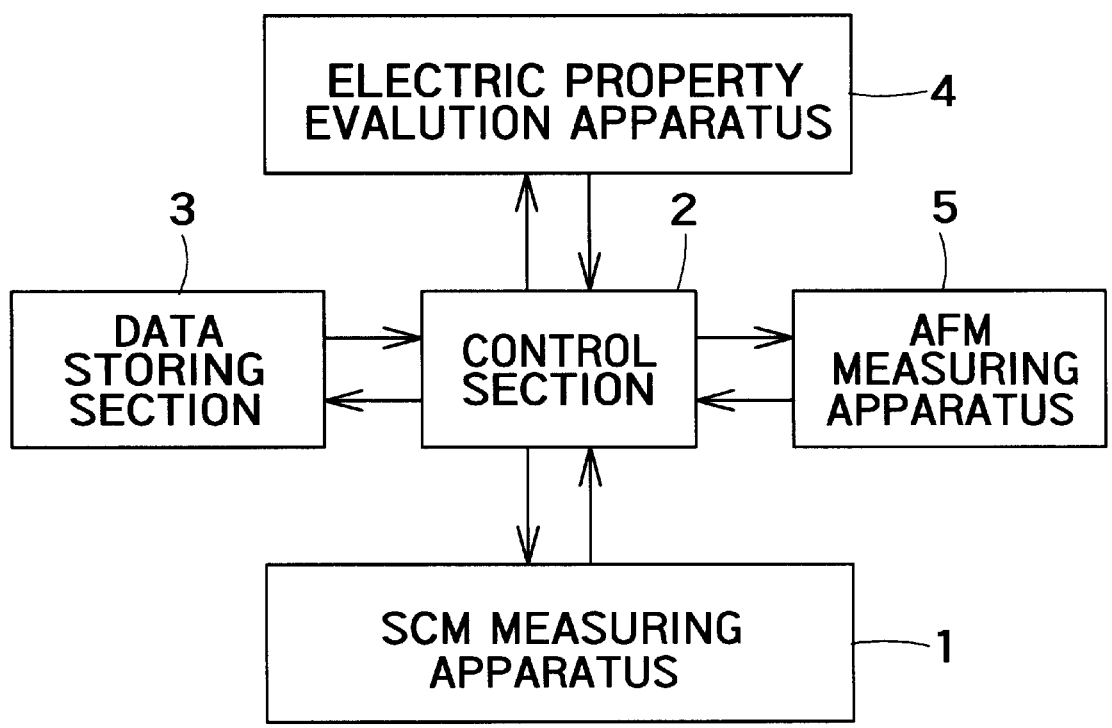
FIG. 21 is a diagram showing schematic configuration of semiconductor evaluation apparatus.

FIG. 21 is a diagram showing schematic configuration in the ninth embodiment of the semiconductor evaluation apparatus according to the present invention. The apparatus in FIG. 21 has a feature in which the SCM measuring apparatus 1, the AFM measuring apparatus 5 and the electric property evaluation apparatus 4 is provided.

Figure 22:
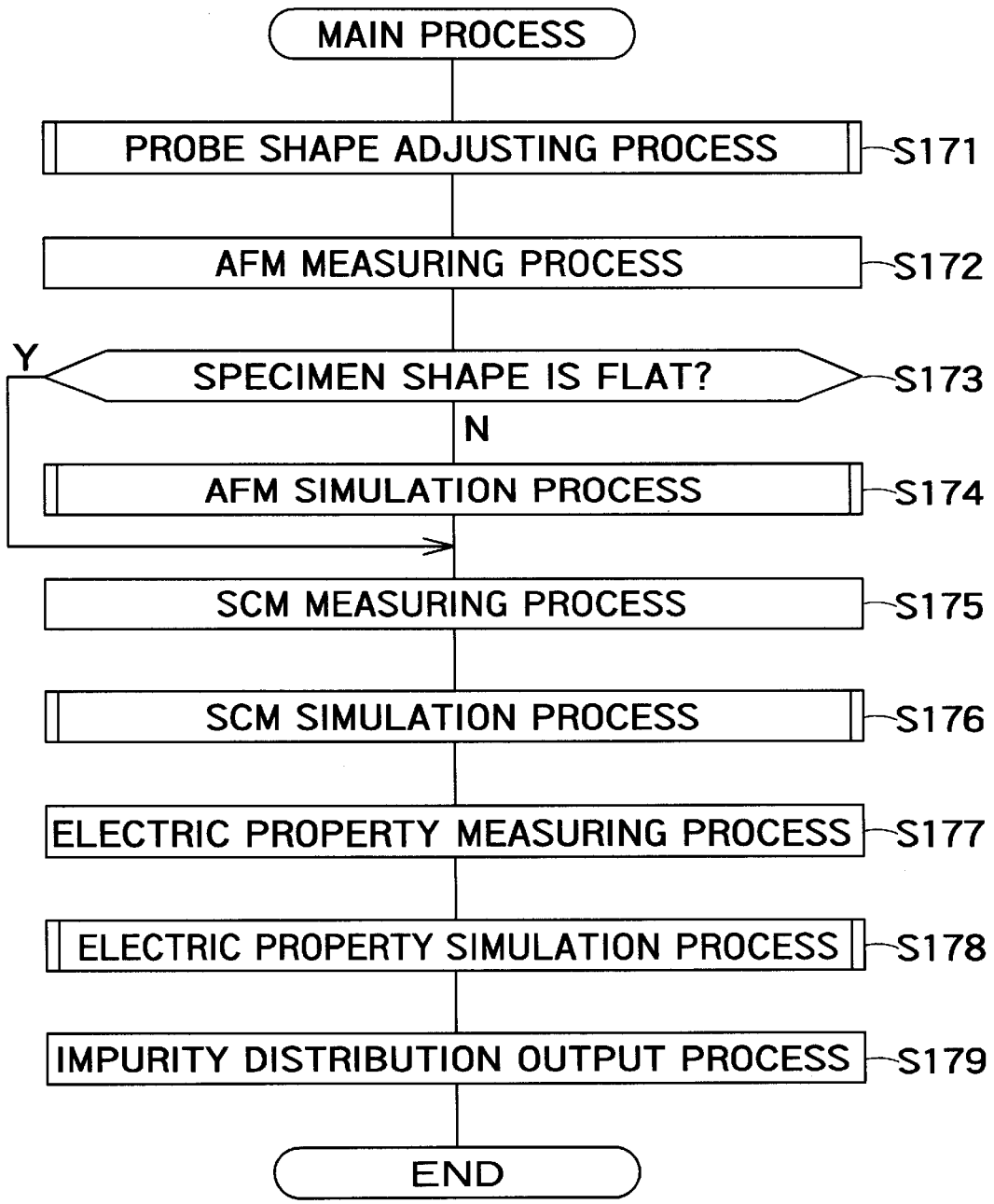
FIG. 22 is a flowchart showing main process performed by the control section in ninth embodiment of semiconductor evaluation apparatus.

FIG. 22 is a flowchart showing the main process performed by the control section in the ninth embodiment of the semiconductor evaluation apparatus. In step S171–S176, the same process as that of step S141–S146 are performed in order to detect the surface shape of the specimen and the impurity distribution in the specimen with high-accuracy.

Next, in step S177–S179, the same process as that of step S54–S56 in FIG. 8 are performed. And then on the basis of the result comparing the measured result of the electric property with the simulated result, the impurity distribution is adjusted; as a result, the impurity distribution with higher-resolution and higher-accuracy is detected.

Tenth Embodiment

A tenth embodiment judges whether or not the simulated result is definitively determined for each of the AFM simulation process, the SCM simulation process, and the electric property simulation process.

Figure 23:
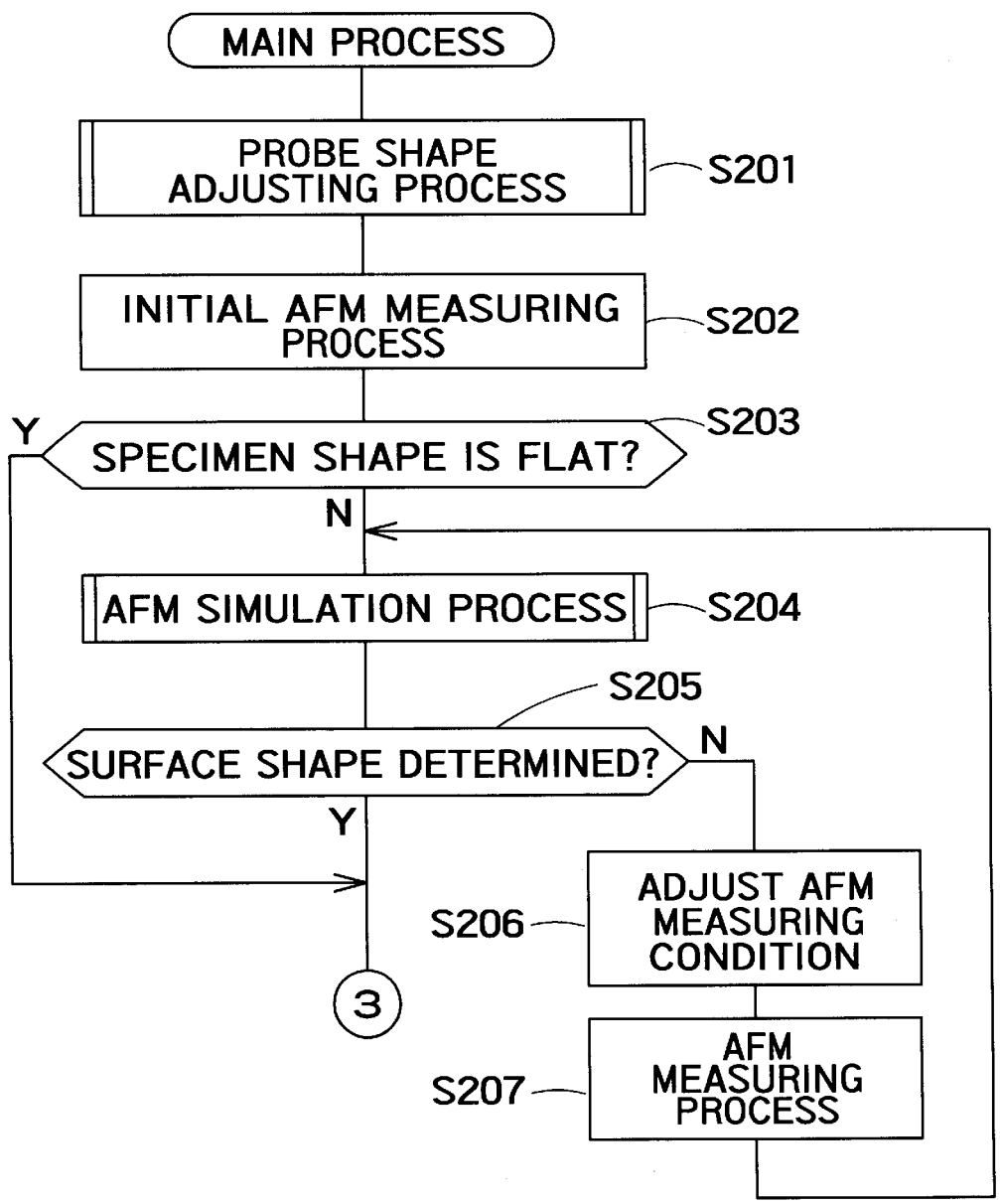
FIG. 23 is a flowchart showing main process performed by the control section in tenth embodiment of semiconductor evaluation apparatus.
Figure 24:
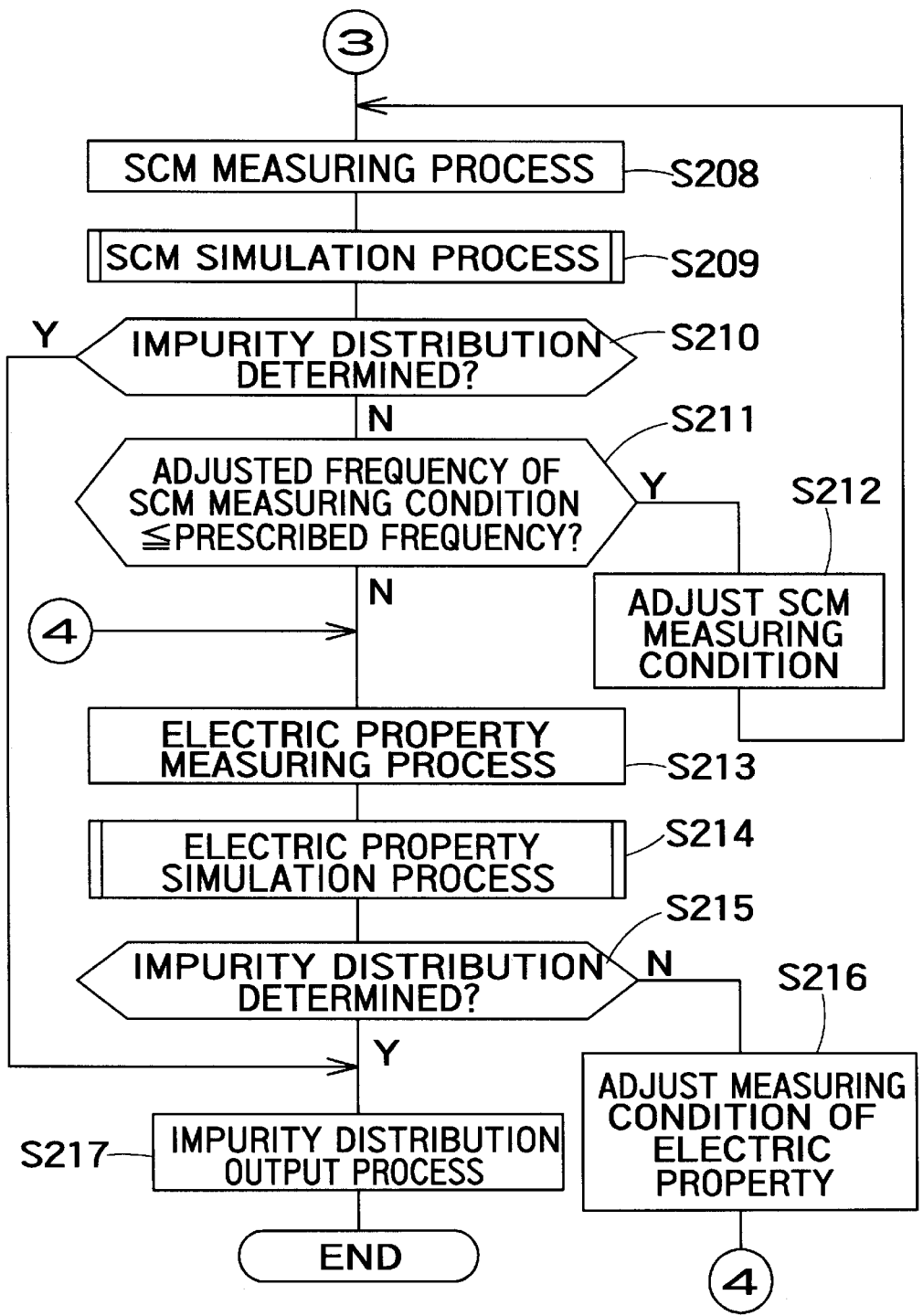
FIG. 24 is a flowchart following on FIG. 23.

FIG. 23 and FIG. 24 is a flowchart showing the main process performed by the control section in the tenth embodiment of the semiconductor evaluation apparatus. In step S201–S207 in FIG. 23, similar to step S151–S157 in FIG. 20, the surface shape of the measuring specimen is analyzed on the basis of the result of the AFM measurement and the simulated result.

Further, in step S209 in FIG. 24, the SCM simulation process is performed in order to adjust the impurity distribution inside the specimen obtained by the SCM measurement. Next, in step S210, whether or not it is possible to definitively determine the impurity distribution is judged. In case of being unable to definitively determine, the process of step S211 is performed.

In step S211, similar to step S85 in FIG. 11, whether or not the adjusted frequency is less than a prescribed frequency is judged. That is, if the adjusted frequency is less than or equal to the prescribed frequency, the measuring conditions for the SCM measurement are changed in step S212, and then the process of step S208 is performed. On the other hands, if the adjusted frequency is more than the prescribed frequency, the process of step S213 is performed. Thereafter, in step S213–S217, similar to step S87–S91 in FIG. 11, the impurity distribution is adjusted on the basis of the measured result of the electric property and the simulated result.

Eleventh Embodiment

A eleventh embodiment performs the analysis of the semiconductor device in the fabrication system of the semiconductor device.

Figure 25:
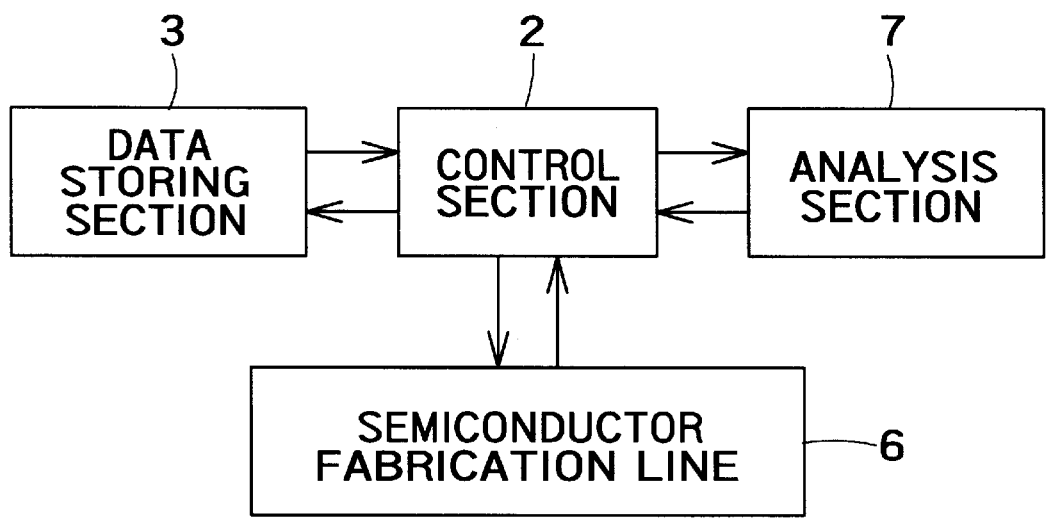
FIG. 25 is a diagram showing schematic configuration of semiconductor fabrication system.

FIG. 25 is a diagram showing schematic configuration of the semiconductor fabrication system. The semiconductor fabrication system in FIG. 25 comprises a semiconductor fabrication line 6 that fabricates the semiconductor devices, a control section 2 that controls the semiconductor fabrication line 6, a analysis section 7 that analyzes the semiconductor devices in accordance with indication of the control section 2, a data storing section 3 in which the control data controlling the control section 2 and the analyzed result by the analysis section 7 are stored.

Figure 26:
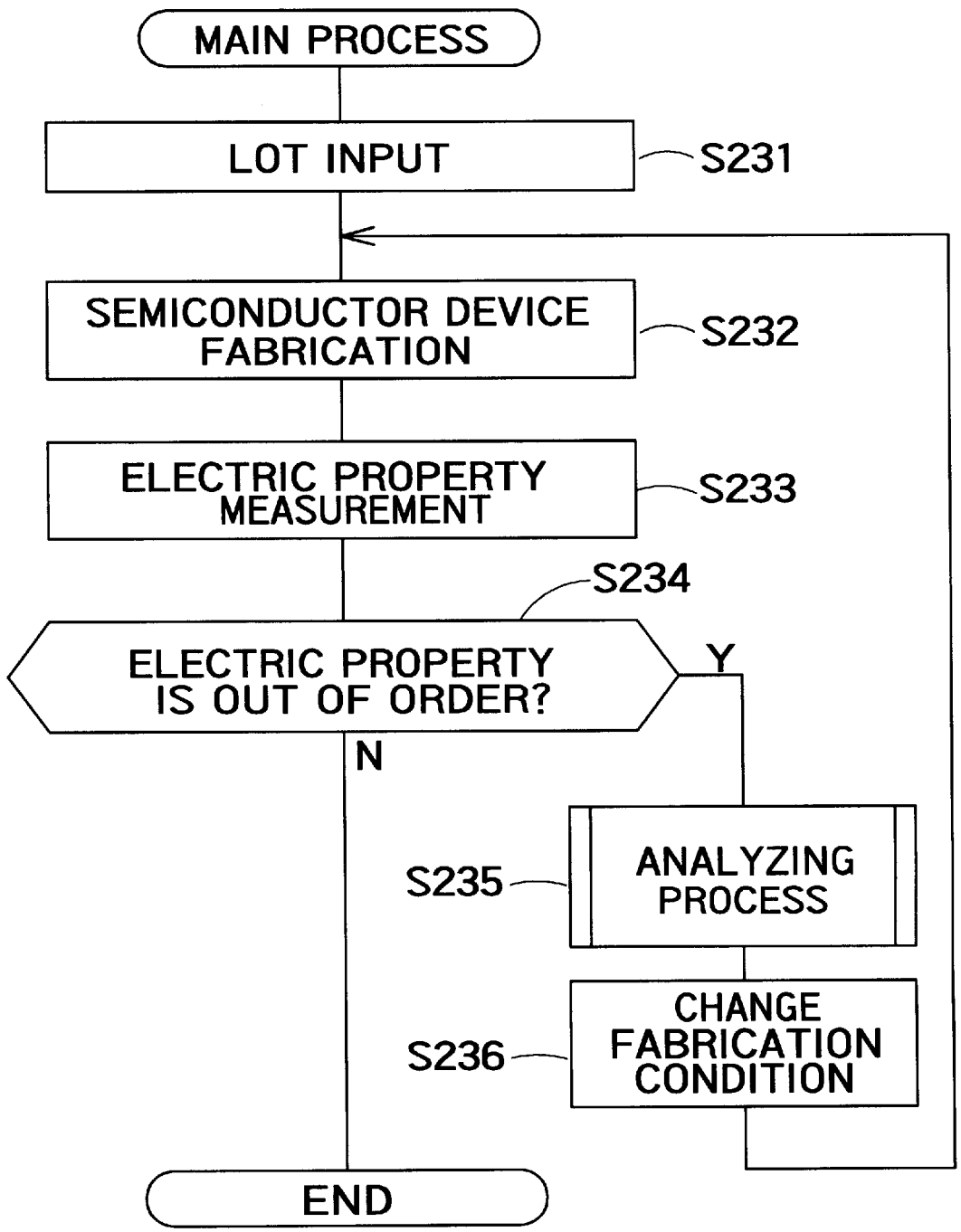
FIG. 26 is a flowchart showing main process performed by the control section in eleventh embodiment of semiconductor fabrication system.

FIG. 26 is a flowchart showing the main process of the control section 2 in the eleventh embodiment. In step S231, the lot composed of a plurality of wafers is inputted. Next, in step S232, after setting prescribed fabrication conditions in the semiconductor fabrication line 6, the semiconductor devices are fabricated. Next, in step S233, the process measuring the electric property of the fabricated semiconductor device is performed. Next, in step S234, whether or not the measured electric property is out of order is judged. If not being out of order, the process is finished. Conversely, if being out of order, the analyzing process showing a detail in FIG. 27–FIG. 30 is performed in step S235. In this analyzing process, for example, the analysis of the surface shape of the measuring specimen is performed, and then the fabrication conditions are conversely extracted on the basis of the obtained surface shape, and then the deviation from the condition fabricated actually is detected.

Next, in step S236, the fabrication conditions are changed based on the detected deviation, and then the fabrication of the semiconductor devices is performed under the changed fabrication conditions in step S232. The changed fabrication conditions is, for example, the diffusion temperature, the diffusion time, the ion implantation energy, the amount for the ion implantation, the flow of gas, and so on.

Figure 27:
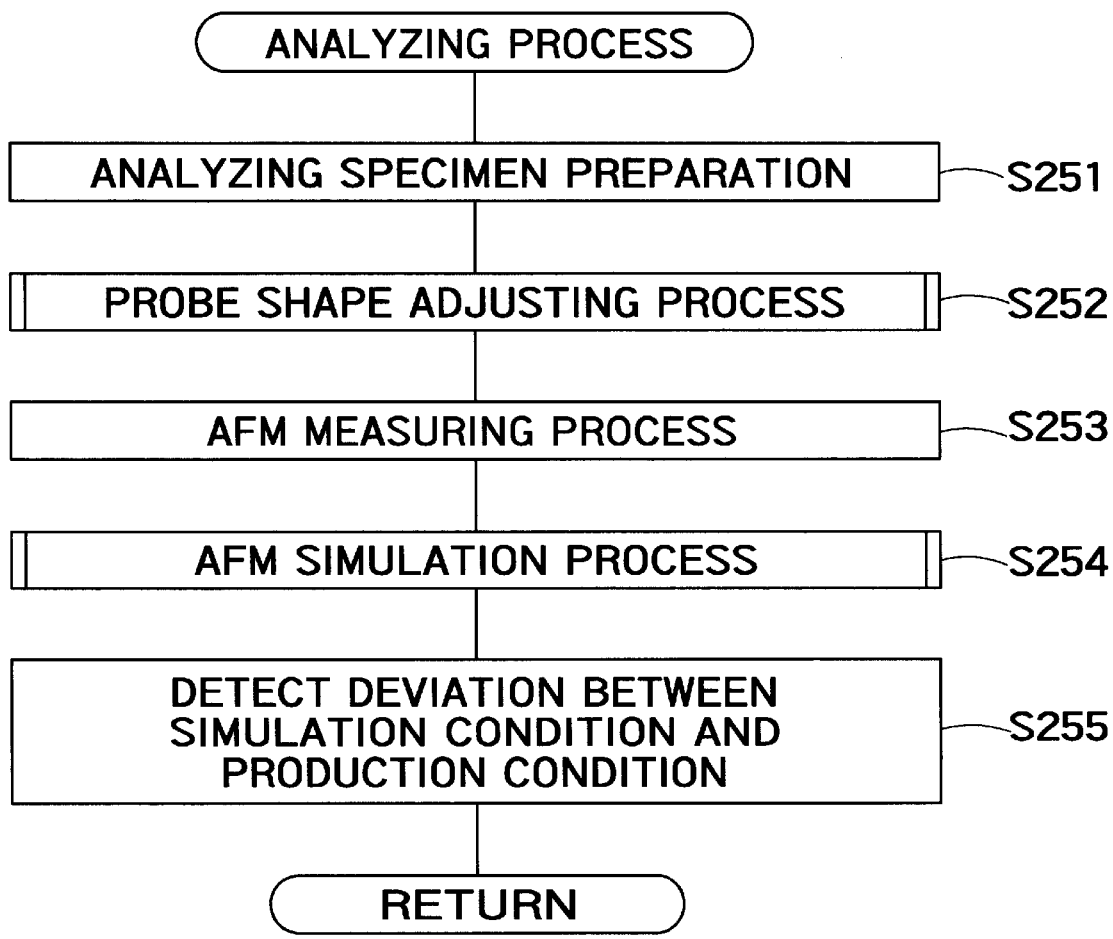
FIG. 27 is a flowchart showing in detail analyzing process of step S235 in FIG. 26.

Next, a detail of the analyzing process of step S235 in FIG. 26 will be explained on the basis of the flowchart in FIG. 27. In step S251, after transferring the wafers or chips being out of order, the analyzing specimen is prepared. Next, in step S252, the process adjusting the probe shape similar to step S101 in FIG. 13 is performed in order to definitively determine the shape of the probe tip. Next, in step S254, the AFM simulation process showing a detail in FIG. 16 is performed in order to conversely extract the simulation condition of the shape simulation reproducing the result of the AFM measurement, i.e. the fabrication conditions. Next, in step S255, the simulation condition in the AFM simulation process and the fabrication conditions in the semiconductor fabrication line 6 are compared with each other in order to detect the deviation of the fabrication conditions.

Figure 28:
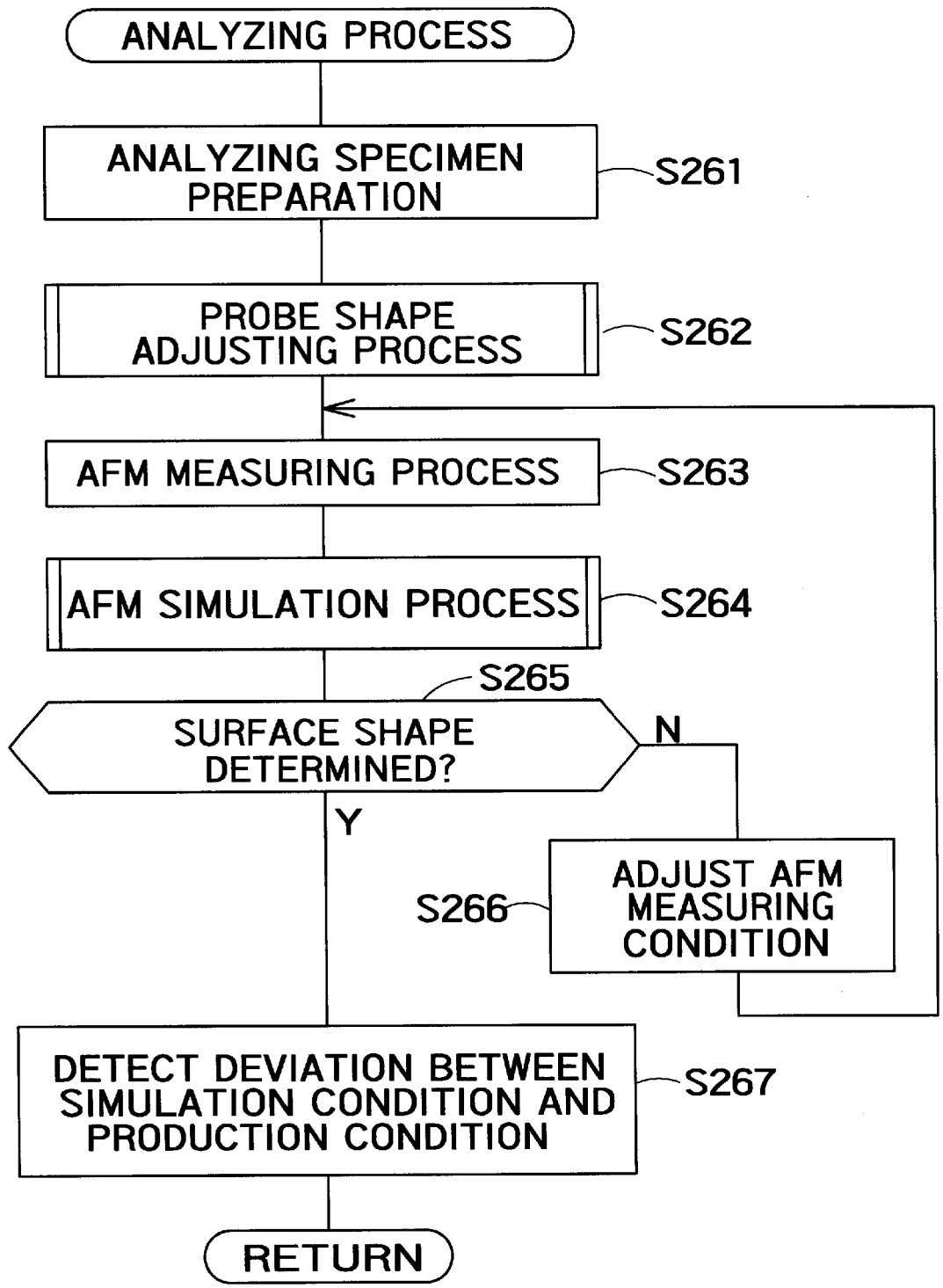
FIG. 28 is a flowchart showing a first different example in FIG. 27.

FIG. 28 is a flowchart showing a first different example of the analyzed process. The process of step S261–S264 is similar to that of step S251–S254 in FIG. 27. In step S265, by means of the AFM simulation process, whether or not it is possible to definitively determine the surface shape of the specimen is judged. If being unable to determine, the measuring conditions during the AFM measurement, for example, the distance between the probe tip and the specimen, the scanning velocity, and so on, are adjusted. And then the AFM measuring process of step S263 is performed again. On the other hands, in case the surface shape of the specimen can be definitively determined, similar to step S255 in FIG. 27, the deviation of the fabrication conditions is detected.

Figure 29:
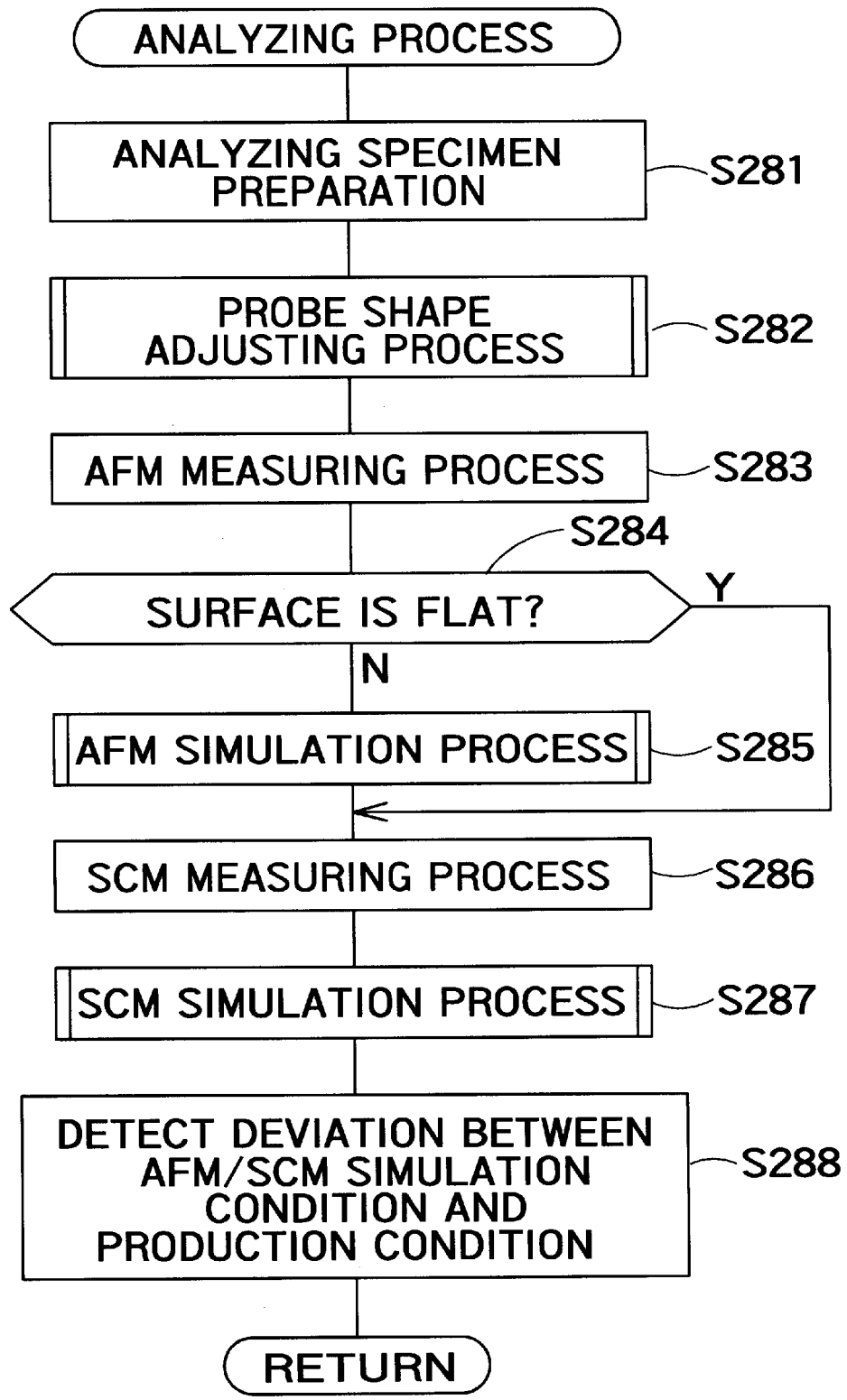
FIG. 29 is a flowchart showing a second different example in FIG. 27.

FIG. 29 is a flowchart showing a second different example of the analyzing process. In step S281–S283, the same process as that of step S251–S253 is performed. In the process adjusting the probe shape in step S281, instead of the method using the AFM standard specimen, the SCM standard specimen of step S1 may be used to adjust. In step S284, whether or not the surface of the specimen is flat is judged on the basis of the analyzing result of the surface shape. If not being flat, the AFM simulation process in step S285 is performed in order to analyze the surface shape.

On the other hands, if determined the surface of the specimen is flat, the AFM simulation process is omitted, and then the process of step S286 is performed. In the following step S286 and S287, the SCM measurement and the SCM simulation showing the detail in FIG. 4 or FIG. 5 are performed, and then the simulation condition of the process simulation reproducing the result of the SCM measurement, that is, the fabrication conditions are conversely extracted. Next, in step S288, by comparing among the simulation conditions of the AFM simulation process, the simulation conditions of the SCM simulation process, and the fabrication conditions of the semiconductor fabrication line 6, the deviation of the fabrication conditions are detected.

Figure 30:
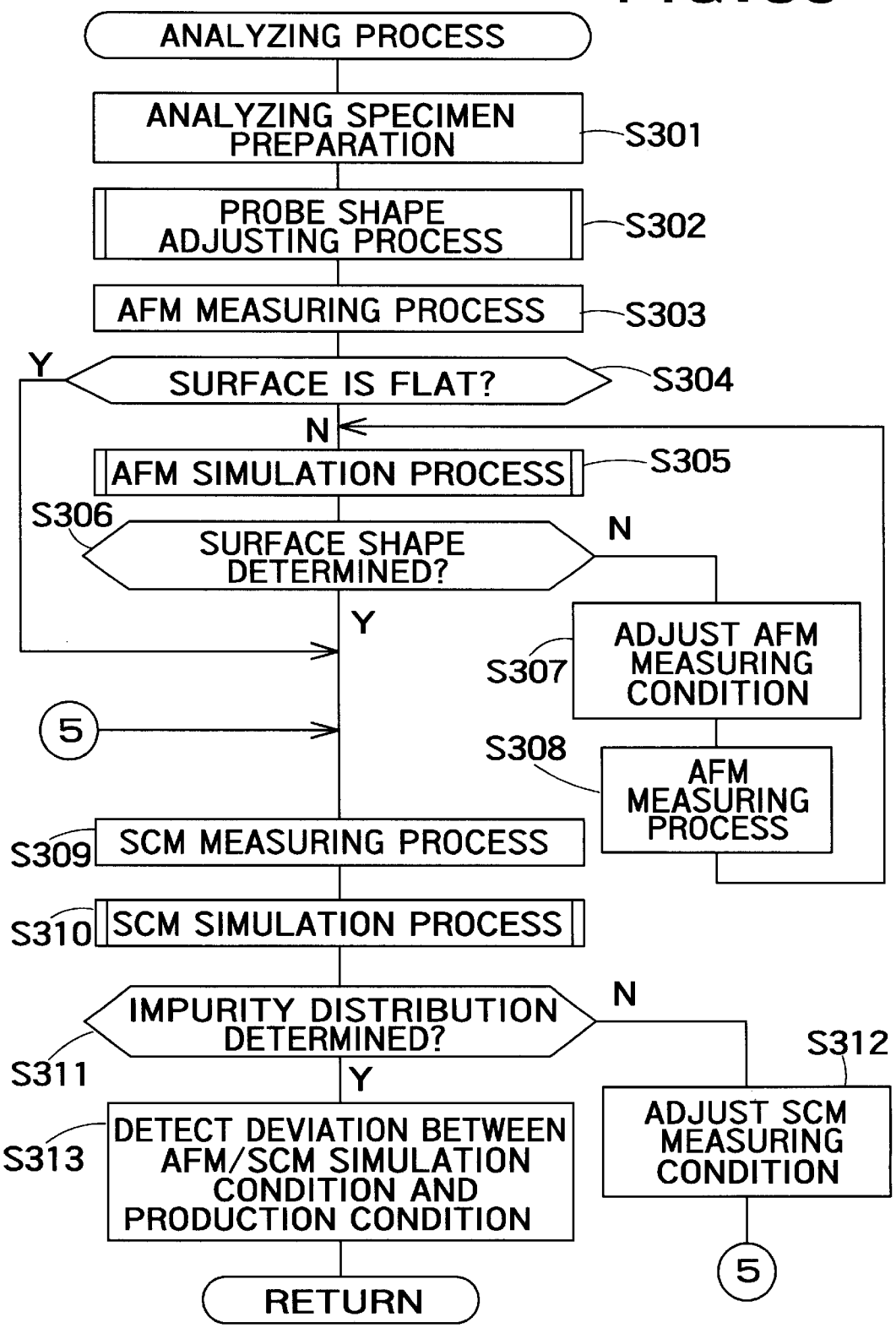
FIG. 30 is a flowchart showing a third different example in FIG. 27.

FIG. 30 is a flowchart showing a third different example of the analyzing process. In step S305–S308, the AFM simulation process is performed. By means of the process, whether or not the surface shape can be definitively determined is judged on the basis of the simulated result. If not being able to definitively determine the surface shape, the AFM measuring conditions are adjusted in order to perform the AFM measurement again.

In the same way, in step S309–S313, after the SCM simulation process is performed, whether or not the impurity distribution can be definitively determined is judged, and if being unable to definitively determine the impurity distribution, the SCM measuring conditions are adjusted, and then the SCM measurement is performed again.

Thus, in the eleventh embodiment, in case the electric property of the semiconductor device fabricated by the semiconductor fabrication line 6 is out of order, because the deviation of the fabrication condition of the semiconductor fabrication line 6 is adjusted by analyzing the impurity distribution of the semiconductor devices and the surface shape, it is possible to quickly deal with the fabrication defect, and it is possible to reduce the defective rate.

The constituent members constituting the semiconductor evaluation apparatus showing in FIG. 1, FIG. 7, FIG. 12, and the semiconductor fabrication system showing in FIG. 25 may be aggregated one box. Otherwise, they may be connected to each other via the network.

Further, in the above-mentioned each embodiment, the process the control section 2 performs has been explained. However, these process may be performed by whichever of software or hardware.

Twelfth Embodiment

A twelfth embodiment has a feature in which it is possible to perform the SCM measurement even if a depletion layer is formed in the measuring specimen.

In the semiconductor device, in accordance with the difference of work function, the depletion layer is generally formed in the measuring specimen. In the depletion layer, the carrier concentration goes down, and the SCM signal obtained by the SCM measurement also goes down. Further, as the case may be, the SCM signal goes down at a level lower than a measurable limit value. In this case, even if performing the SCM simulation process, it is impossible to adjust.

Figure 32:
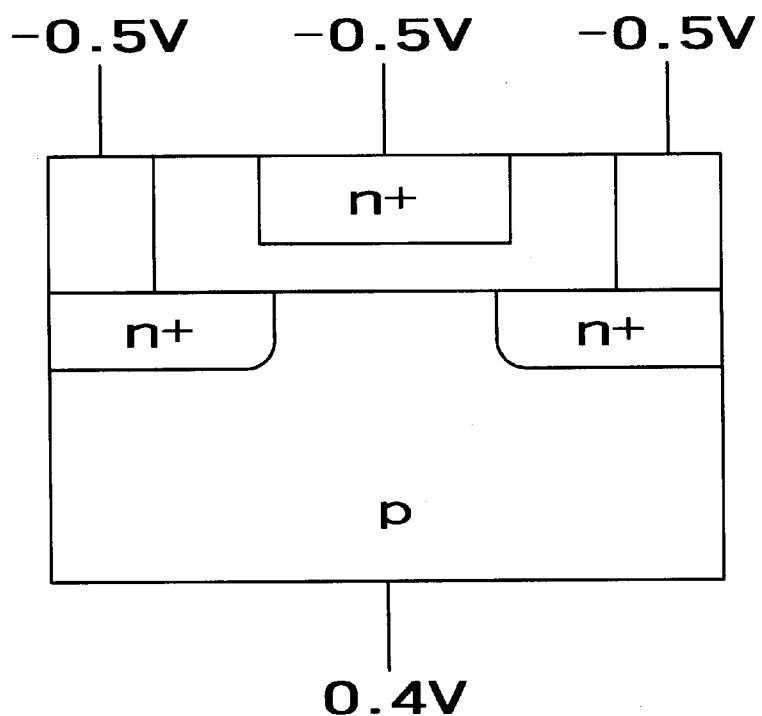
FIG. 32 is a diagram showing depletion layer formed in measuring specimen.
Figure 33:
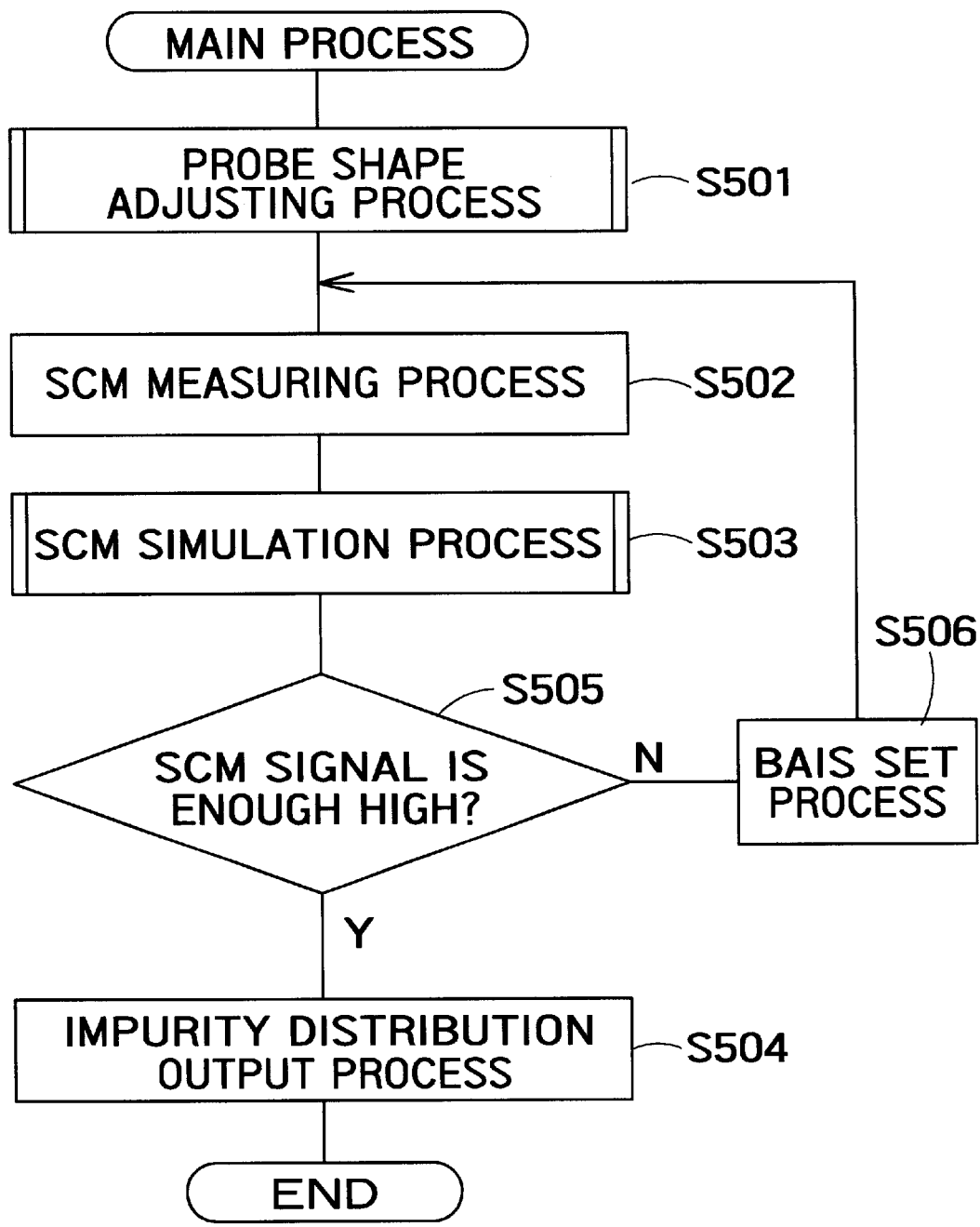
FIG. 33 is a diagram supplying voltage so that depletion layer is not formed in measuring specimen.

Therefore, as shown in FIG. 32, the twelfth embodiment supplies voltage so that the depletion layer extinguishes. The supplied voltage is determined on the basis of the potential distribution obtained from the Poisson equation solved in order to perform the SCM simulation.

For example, in case the center of the band gap of the intrinsic semiconductor is set to the basis of the potential, the following built-in potential occurs. That is, about (+0.5)V in $n^+$ region with the concentration of about $10^{20}$ $cm^{-3}$, or about (−0.4)V in $p^+$ region with the concentration of about $10^{17}$ $cm^{-3}$. If a voltage to cancel the built-in potential is supplied to a terminal of the semiconductor device, the depletion layer extinguishes and it is possible to measure the impurity distribution with high-accuracy.

Figure 31:
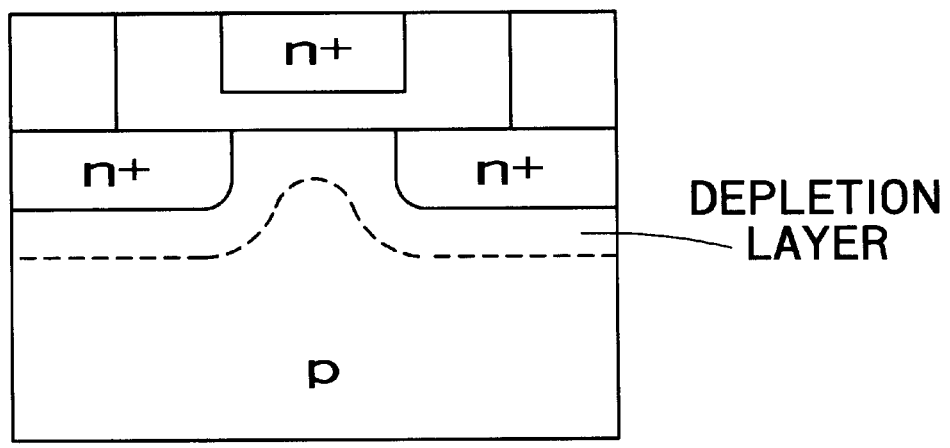
FIG. 31 is a flowchart showing main process performed by the control section in twelfth embodiment of semiconductor evaluation apparatus.

FIG. 31 is a flowchart showing the main process performed by the control section in the twelfth embodiment of the semiconductor evaluation apparatus. In step S501–S503 in FIG. 31, the same process as that of step S1–S3 in FIG. 2 is performed. In step S504, whether or not the SCM signal level measured by the SCM measuring apparatus 1 is lower than a prescribed signal level is judged. More specifically, whether or not the SCM signal is a faint signal with signal level lower than measuring limit is judged.

If the SCM signal is lower than the measuring limit, a bias setting process is performed in step S505. In this bias setting process, as shown in FIG. 32, the depletion layer is extinguished by supplying the bias voltage to the measuring specimen. Next, the process of step S502 is performed.

On the other hands, in step S505, if the SCM signal level higher than the measuring limit, the process of step S504 is performed. In step S504, similar to step S4 in FIG. 2, the impurity distribution adjusted by the SCM simulation process is outputted to the display apparatus, the printer, and so on which are unshown.

Thus, in the twelfth embodiment, because the SCM measurement is performed while allowing the depletion layer inside the measuring specimen to extinguish, the signal level of the SCM signal obtained by the SCM measurement is not lower than the measuring limit. Accordingly, it is possible to improve the measuring accuracy.

What is claimed is:

1. A semiconductor evaluation apparatus comprising SCM measuring means for measuring a CV property showing a relationship between a capacitance C between a probe tip and a specimen, and a voltage V supplied to the specimen via the probe tip, comprising:

probe shape adjusting means for adjusting shape data of the probe tip inputted in advance based on the result of measuring the CV property of a standard specimen having an impurity distribution already known, the shape data numerically expressing the shape of the probe tip, and SCM simulation means for determining the impurity distribution inside the measuring specimen on the basis of a result of comparing the CV property of the measuring specimen calculated based on the shape data of said adjusted probe tip with the CV property of the measuring specimen measured by said SCM measuring means.

2. The semiconductor evaluation apparatus according to claim 1, comprising:

impurity distribution judging means for judging whether or not the impurity distribution in the measuring specimen is determined to be of one type, and SCM measuring condition adjusting means for adjusting the measuring conditions for said SCM measuring means, wherein:

said SCM simulation means determines the impurity distribution based on a result of comparing the CV property of the measuring specimen calculated based on the shape data of said adjusted probe tip with the CV property of the measuring specimen measured by said SCM measuring means under said adjusted measuring conditions.

3. The semiconductor evaluation apparatus according to claim 1, comprising:

electric property measuring means for measuring electric property including at least one of a capacitance between a gate and a substrate, a capacitance between the gate and a source, a capacitance between the gate and a drain, a threshold voltage, a drain current, a substrate current, and a gate current, and electric property simulation means for adjusting the impurity distribution determined by said SCM simulation means on the basis of a result of comparing the electric property calculated based on the impurity distribution determined by said SCM simulation means with the electric property measured by said electric property measuring means.

4. The semiconductor evaluation apparatus according to claim 1, comprising:

first impurity distribution judging means for judging whether or not the impurity distribution inside the measuring specimen is determined to be of one type;

measuring condition adjusting frequency judging means for judging whether or not frequency adjusting the measuring conditions in said SCM measuring means is less than or equal to a prescribed frequency;

electric property measuring means for adjusting the measuring conditions for said SCM measuring means in case said adjusted frequency is less than or equal to said prescribed frequency, and measuring the electric property including at least one of a capacitance between a gate and a substrate, a capacitance between the gate and a source, a capacitance between the gate and a drain, a threshold voltage, a drain current, a substrate current, and a gate current, in case said adjusted frequency is larger than said prescribed frequency;

electric property simulation means for adjusting the impurity distribution determined by said SCM simulation means on the basis of the electric property measured by the electric property measuring means and the electric property calculated based on the impurity distribution determined by said SCM simulation means;

second impurity distribution judging means for judging whether or not the impurity distribution inside the measuring specimen is determined to be of one type, by performing the process by said electric property simulation means, and electric property condition adjusting means for adjusting the measuring conditions for said electric property measuring means, in case said second impurity distribution judging means judges that the impurity distribution is not determined to be of one type, wherein:

in case said first impurity distribution judging means judges that the impurity distribution is determined to be of one type, the impurity distribution determined by said SCM simulation means is determined as a definitive impurity distribution, and in case said first impurity distribution judging means judges that the impurity distribution is not determined to be of one type and said second impurity distribution judging means judges that the impurity distribution is determined to be of one type, the impurity distribution adjusted by said electric property simulation means is determined as the final impurity distribution.

5. The semiconductor evaluation apparatus according to claim 1, wherein:
said probe shape adjusting means includes standard CV property measuring means for measuring the CV property for said standard specimen by said SCM measuring means, first device simulation means for calculating the CV property for said standard specimen based on the shape data of the inputted probe tip, probe tip shape adjusting means for adjusting the shape data of the probe tip used for the calculation in said first device simulation means, so that the CV property measured by said standard CV property measuring means coincides with the CV property calculated by said first device simulation means.

6. The semiconductor evaluation apparatus according to claim 1, wherein:
said SCM simulation means includes impurity distribution estimating means for estimating the impurity distribution inside the measuring specimen based on the CV property for the measuring specimen measured by said SCM measuring means, second device simulation means for calculating the CV property for the measuring specimen based on the shape data of the probe tip adjusted by said probe shape adjusting means and the impurity distribution estimated by said impurity distribution estimating means, and impurity distribution adjusting means for adjusting the impurity distribution estimated by said impurity distribution estimating means so that the CV property for the measuring specimen measured by said SCM measuring means coincides with the CV property calculated by said second device simulation means.

7. The semiconductor evaluation apparatus according to claim 1, wherein:
said SCM simulation means includes process simulation means for calculating the impurity distribution inside the measuring specimen based on prescribed fabrication conditions, second device simulation means for calculating the CV property for the measuring specimen based on the shape data of the probe tip adjusted by said probe shape adjusting means and the impurity distribution calculated by said process simulation means, and PS (Process Simulation) parameter adjusting means for adjusting the fabrication conditions used for the calculation by said process simulation means so that the CV property for the measuring specimen measured by said SCM measuring means coincides with the CV property calculated by said second device simulation means.

8. The semiconductor evaluation apparatus according to claim 1, comprising:
SCM signal level judging means for judging whether or not a signal level of the SCM signal obtained by said SCM measuring means is smaller than or equal to a prescribed level; and
voltage supply means for supplying a voltage for the measuring specimen so that the depletion layer formed in the measuring specimen is extinguished in case the signal level of said SCM signal is smaller than or equal to said prescribed level.

9. The semiconductor evaluation apparatus according to claim 8, wherein:
said voltage supply means sets the voltage to supply on the basis of a potential distribution obtained by solving a Poisson equation used for simulation process by said SCM simulation means.

10. A semiconductor fabrication system including a semiconductor fabrication apparatus, comprising:
electric property measuring means for measuring the electric property of said semiconductor apparatus fabricated by said semiconductor fabrication apparatus;
semiconductor evaluation apparatus for analyzing at least one of an impurity distribution and a surface shape of a measuring specimen, said electric property of which is determined to be out of order by said electric property measuring means;
fabrication condition error detecting means for detecting a deviation between fabrication conditions extracted conversely based on a result analyzed by the semiconductor evaluation apparatus and fabrication conditions detected by the fabrication condition error detecting means, and
fabrication condition changing means for changing the fabrication conditions for said semiconductor fabrication based on the deviation of the fabrication conditions detected by the fabrication condition error detect means, wherein:
said semiconductor evaluation apparatus includes SCM measuring means for measuring the CV property showing the relationship between the capacitance C between the probe tip and the measuring specimen, and the voltage V supplied to the measuring specimen via the probe tip, probe shape adjusting means for adjusting the shape data of the probe tip inputted in advance based on a result of measuring the CV property for the standard specimen having a known impurity distribution by said SCM measuring means, the shape data numerically expressing the shape of the probe tip, and SCM simulation means for determining the impurity distribution inside the measuring specimen based on a result of comparing the CV property for the measuring specimen calculated by using the shape data of the adjusted probe tip with the CV property for the measuring specimen measured by said SCM measuring means.

11. A semiconductor evaluation apparatus comprising an AFM measuring means for analyzing surface shape of a specimen based on a force working between the specimen and a probe tip placed above the specimen, comprising:
probe shape adjusting means for adjusting shape data of the probe tip inputted in advance based on the result of measuring the surface shape of the standard specimen by said AFM measuring means, the shape data numerically expressing the shape of the probe tip, and
AFM simulation means for determining the surface shape of the measuring specimen based on a result of comparing the surface shape of the measuring specimen calculated by using the shape data of the adjusted probe tip with the surface shape of the measuring specimen measured by said AFM measuring means.

12. A semiconductor evaluation apparatus according to claim 11, comprising:
surface shape judging means for judging whether or not the surface shape of the measuring specimen is definitively determined by performing a process by said AFM simulation means;
AFM measurement condition adjusting means for adjusting measuring conditions by said AFM measuring means, wherein:
said AFM simulation means determines the surface shape of the measuring specimen based on a result of comparing the CV property for the measuring specimen calculated by using the shape data of the adjusted probe tip with the surface shape measured by said AFM measuring means under said adjusted measuring condition.

13. A semiconductor evaluation apparatus according to claim 11, comprising:
surface flat judging means for judging whether or not the surface of the measuring specimen is flat based on the result measured by said AFM measuring means, wherein:
said AFM simulation means perform a calculation process only in case said surface flat judging means judges the surface is flat.

14. The semiconductor evaluation apparatus according to claim 11, wherein:
said AFM simulation means includes third device simulation means for calculating the surface shape of the measuring specimen based on the surface shape of the measuring specimen measured by said AFM measuring means and the shape data of the probe tip adjusted by said probe shape adjusting means, and surface shape adjusting means for adjusting the surface shape data used for calculation by said third device simulation means so that the surface shape measured by said AFM measuring means coincides with the surface shape calculated by said third device simulation means.

15. The semiconductor evaluation apparatus according to claim 11, wherein:
said AFM simulation means includes shape simulation means for calculating the surface shape of the measuring specimen based on prescribed fabrication conditions, and fabrication condition adjusting means for adjusting the fabrication conditions used for calculation by said shape simulation means so that the surface shape measured by said AFM measuring means coincides with the surface shape calculated by said shape simulation means.

16. A semiconductor fabrication system, including a semiconductor fabrication apparatus, comprising:
electric property measuring means for measuring the electric property of said semiconductor apparatus fabricated by said semiconductor fabrication apparatus;
semiconductor evaluation apparatus for analyzing at least one of an impurity distribution and a surface shape, by using said semiconductor apparatus, said electric property of which is determined to be out of order by said electric property measuring means as the measuring specimen;
fabrication condition error detecting means for detecting a deviation between fabrication conditions extracted conversely based on a result analyzed by the semiconductor evaluation apparatus and fabrication conditions detected by the fabrication condition error detecting means, and
fabrication condition changing means for changing fabrication conditions in said semiconductor fabrication based on the deviation of the fabrication conditions detected by the fabrication condition error detect means, wherein:
said semiconductor evaluation apparatus includes probe shape adjusting means for adjusting the shape data of the probe tip inputted in advance based on a result of measuring the surface shape of the standard specimen by said AFM measuring means, the shape data numerically expressing the shape of the probe tip, and AFM simulation means for determining the surface shape of the measuring specimen means for determining the surface shape of the measuring specimen based on a result comparing the surface shape of the measuring specimen calculated by using the shape data of the probe tip with the surface shape of the measuring specimen measured by said AFM measuring means.

* * * * *

UNITED STATES PATENT AND TRADEMARK OFFICE
CERTIFICATE OF CORRECTION

PATENT NO. : 6,211,686 B1
DATED : April 3, 2001
INVENTOR(S) : Matsuzawa et al.

It is certified that error appears in the above-identified patent and that said Letters Patent is hereby corrected as shown below:

<u>Title page,</u>
Item [57], ABSTRACT,
Line 7, change "a impurity" to -- an impurity --.

<u>Column 19, claim 8,</u>
Line 58, change "level; and" to -- level, and --.

Signed and Sealed this

Twenty-ninth Day of January, 2002

Attest:

Attesting Officer

JAMES E. ROGAN
*Director of the United States Patent and Trademark Office*